United States Patent [19]

Yasuda et al.

[11] Patent Number: 4,796,013
[45] Date of Patent: Jan. 3, 1989

[54] CAPACITIVE OCCUPANCY DETECTOR APPARATUS

[75] Inventors: Tomio Yasuda, Kasukabe; Jun Sato, Ibaraki; Masao Ohashi, Kariya, all of Japan

[73] Assignee: Aisin Seiki Kabushiki Kaisha, Kariya, Japan

[21] Appl. No.: 919,272

[22] Filed: Oct. 15, 1986

[30] Foreign Application Priority Data

Oct. 18, 1985 [JP] Japan .................. 60-232371
Dec. 13, 1985 [JP] Japan .................. 60-280300
Mar. 27, 1986 [JP] Japan .................. 61-68960

[51] Int. Cl.$^4$ .................. G08B 21/00; G08B 13/26
[52] U.S. Cl. .................. 340/562; 180/272; 307/10 R; 340/540
[58] Field of Search .......... 340/562, 568, 540, 52 E, 340/52 D, 939, 677; 180/272; 307/10 SB, 10 R, 125, 116

[56] References Cited

U.S. PATENT DOCUMENTS 3,898,472 8/1975 Long .................. 340/562
4,476,461 10/1984 Carubia .................. 340/667
4,491,841 1/1985 Clark .................. 340/939

Primary Examiner—Glen R. Swann, III
Attorney, Agent, or Firm—Sughrue, Mion, Zinn, Macpeak, and Seas

[57] ABSTRACT

A capacitive occupancy detector apparatus includes a personnel containment device having first and second electrodes which will define an electric field therebetween which will be intercepted by a person present in the containment device. A detecting device is provided for detecting the capacitance formed between the first and second electrodes and a processor is provided for storing the capacitance at predetermined periods. The difference between the last capacitance detected and a capacitance previously stored is detected to determine the presence of a person when the difference indicates an increase of the capacitance exceeding a first predetermined threshold. A second threshold is set based upon the capacitance which determines the presence of a person so that the subsequent determination of the absence of a person is based upon detecting a decrease of the capacitance with respect to the second threshold.

12 Claims, 32 Drawing Sheets

Fig.10a  Fig.10b
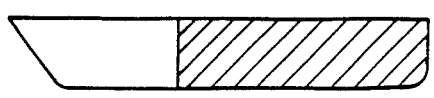 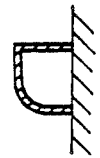
Fig.10c  Fig.10d
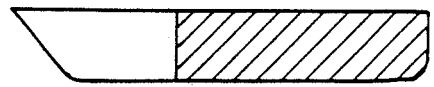 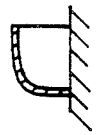
Fig.10e  Fig.10f
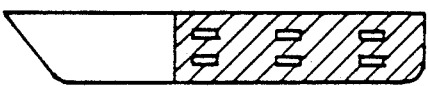 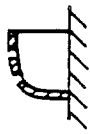
Fig.10g  Fig.10h
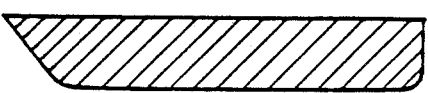 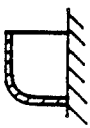
Fig.10i  Fig.10j
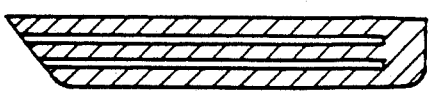 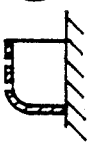
Fig.10k  Fig.10l
 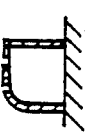

CAPACITIVE OCCUPANCY DETECTOR APPARATUS

BACKGROUND OF THE INVENTION

The invention relates to a personnel detector, or an apparatus which detects the presence or absence of a personnel or personnels in personnel containment means such as a seat in a vehicle, a theater or audience hall.

A certain kind of vehicle is provided with a personnel detector for detecting the presence or absence of an occupant for purposes of preventing a failure to close side windows (including a window of a door located beside a driver's seat, an opposite window or located adjacent to an assistant driver's seat, and other windows of doors which are located directly behind the first mentioned windows) or a sunroof (roof panel), controlling outlet ports of an air conditioner and controlling a car audio set. Thus, when no occupant is detected, any open side window and/or sunroof is controlled so as to be closed. Alternatively, the presence or absence of a personnel is detected for each individual seat so that the direction of outlet ports of the air conditioner or the output balance of the car audio set may be controlled so as to serve the occupied seat or seats.

An occupant detector which is commonly used in a vehicle of the type includes a seating switch, which is embedded in each seat or chair so as to be closed when a personnel is seated thereupon.

Specifically, FIG. 23a is a cross section of an assitant driver's seat of a vehicle, comprising a seat cushion cover 30, a seat cushion pad 31, a pad support 32, a seat cushion spring 33 and a seat cushion frame 34. A seating switch 200 is embedded within the seat cushion pad 31.

FIG. 23b shows the detail of parts around the seating switch 200. In this Figure, it will be noted that the seating switch 200 essentially comprises a movable contact 201 and a stationary contact 202 which is secured to the pad support 32. Both the seat cushion pad 31 and the pad support 32 are formed of a flexible resilient material, and are adapted to flex as an occupant is seated thereupon. However, the seat cushion pad 31 is formed of a more pliable material such as urethane foam, and accordingly, the seat cushion pad 31 may flex relative to the pad support 32 in a manner indicated by phantom line in FIG. 23b. In response thereto, the movable contact 201 moves angularly about its pivot, thus moving into contact with the stationary contact 202 to cause the switch to turn on. The seating switch 200 is connected to an electrical circuit, not shown, so as to provide an indication that an occupant has seated upon the seat.

It will be understood that the disclosed seating switch 200 is mechanically opened and closed in response to the flexure of the seat cushion pad 31 as an occupant is seated. Hence, it is vulnerable by impacts, and is likely to cause faults, in particular, as the occupant gets on the vehicle to produce shocking forces. Because it includes mechanical contacts, it has reduced useful life. In addition, the switch will be turned on if a baggage other than a personnel is placed thereon, thus reducing the reliability of personnel detection.

SUMMARY OF THE INVENTION

It is an object of the invention to provide a personnel detector which is simple in construction and which exhibits an improved reliability.

The above object is accomplished in accordance with the invention by utilizing an arrangement in which the presence or absence of a personnel is detected in accordance with a change in a capacitance between a first and a second electrode which define an electric field therebetween, the change being caused as at least part of a personnel which is seated upon personnel containment means such as a vehicle seat or audience seat in a theater or hall is interposed within the electric field. By way of example, considering a vehicle seat, an electrode plate which is insulated from an electric ground represented by a car body is placed on a surface on which an occupant is seated, and a capacitor is formed by the electrode plate and the ground. When a personnel is seated upon the vehicle seat, a high dielectric constant (nearly 80) of a personnel causes a significant change in the capacitance between the electrode plate and the ground. By monitoring such change, the presence or absence of a personnel can be detected. In this manner, there is provided a non-contacting and contactless personnel detector which exhibits an improved durability because it is free from influences of oscillations or impacts. Since it is only necessary that a change in the capacitance between the first and the second electrode be monitored, the apparatus can be constructed in a very simple manner. Since all that is required is the provision of the first and the second electrode, there is no need of changing the internal and/or external appearance of a vehicle or changing the internal construction of a theater or hall.

Other objects and features of the invention will become apparent from the following description of an embodiment thereof with reference to the drawings.

BRIEF DESCRIPTION OF THE DRAWINGS

FIGS. 5b, 5c and 5d are circuit diagrams illustrating the detail of the input switch circuit of the system shown in FIG. 5a;

FIG. 5e is a block diagram showing the detail of an occupant detector of the system shown in FIG. 5a;

FIG. 6b is an enlarged perspective view of a motor driven mechanism associated with the mechanism of FIG. 6a;

FIG. 6c is a cross section taken along the line VIC—VIC shown in FIG. 6a;

FIG. 7 is a flowchart illustrating the general operation of a microprocessor used in the system of FIG. 5a;

FIGS. 10a, 10b, 10c, 10d, 10e, 10f, 10g, 10h, 10i, 10j, 10k and 10l are front views and cross sections of various modifications of the second embodiment;

FIG. 17 is a block diagram of a window regulator which incorporates the arrangement according to the sixth embodiment shown in FIG. 14a;

FIG. 20b is a side elevation illustrating the construction of a jump-up mechanism shown in FIG. 20a;

DETAILED DESCRIPTION OF EMBODIMENTS

Figure 1A:
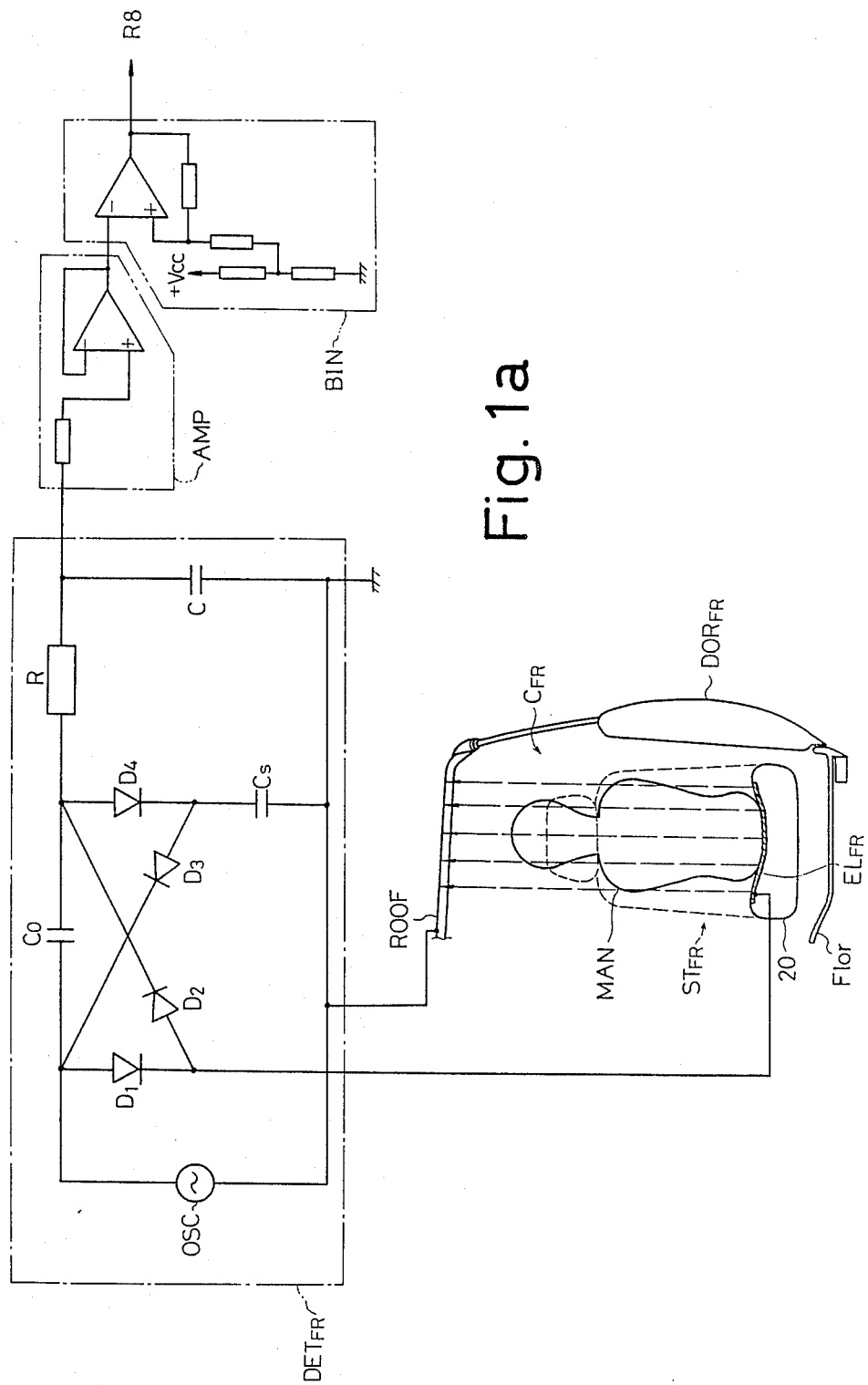
FIG. 1a is a block diagram of a first embodiment of the invention.

Referring to FIG. 1a, there is shown a first embodiment of the invention. Specifically, a vehicle seat $ST_{FR}$ includes a seat cushion 20 on which a detecting electrode $EL_{FR}$ is mounted so as to be disposed opposite to a roof ROOF and separated therefrom by a space located above a driver's seat (hereafter abbreviated by FR seat, standing for a "front, right-hand" seat).

In the present embodiment, the roof ROOF is matallic and thus is of a conductive material, and is electrically connected to other components of a vehicle which are engaged therewith, including a pillar (not shown), doors (including a door $DOOR_{FR}$ and other doors), a floor Flor, all of which are formed of a metallic material. In the description to follow, all these components inclusive of the roof ROOF will be collectively referred to as a body. If the detecting electrode $EL_{FR}$ is used to define an occupant detecting capacitor $C_{FR}$ together with the body, electric lines of force which goes out or enters the detecting electrode $EL_{FR}$ and extending to various parts of the body will be very complex. However, for the convenience of description, it is assumed in the present embodiment that the combination of the detecting electrode $EL_{FR}$ and the roof ROOF defines an occupant detecting capacitor $C_{FR}$. In FIG. 1a, electric lines of force which extend straightforward from the detecting electrode $EL_{FR}$ to the roof ROOF are indicated by broken lines.

The occupant detecting capacitor $C_{FR}$ formed by the detecting electrode $EL_{FR}$ and the roof ROOF is connected to a detector circuit $DET_{FR}$ which detects a change in the capacitance of the capacitance $C_{FR}$. An output from the detector circuit $DET_{FR}$ is amplified by a d.c. amplifier AMP, the output of which is in turn fed to a digitizer BIN which converts the amplifier output into a binary value. In FIG. 1a, rectangles represent resistors.

Figure 2A:
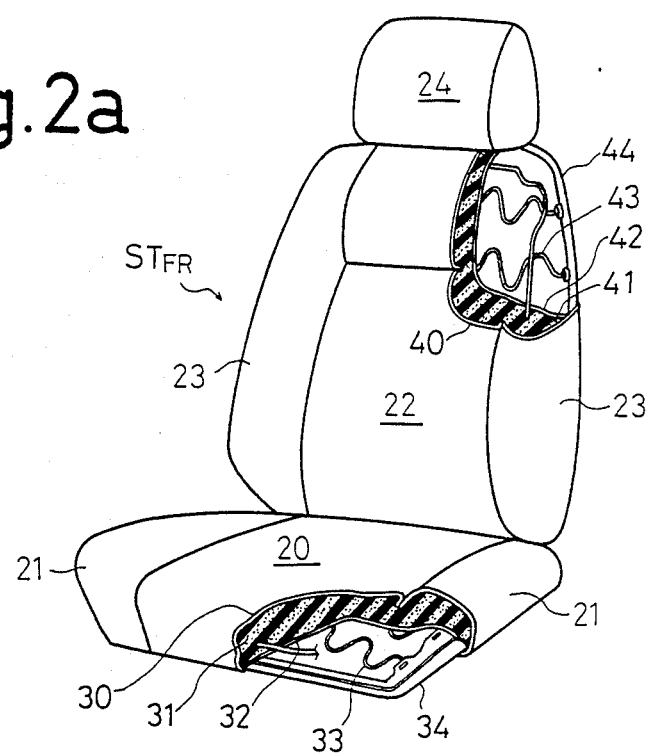
FIG. 2a is a perspective view, partly broken away, of a vehicle seat.

Referring to FIG. 2a momentarily, which shows a perspective view, partly broken away, of the seat $ST_{FR}$, the seat $ST_{FR}$ essentially comprises a seat cushion 20, a seat back 22 and a head rest 24. The opposite sides of the seat cushion 20 are formed as thigh supports 21 which hold the waist of an occupant while the opposite sides of the seat back 22 are formed as side supports 23 which hold the upper body of the occupant. The seat cushion 20 comprises a seat cushion frame 34 on which a seat cushion spring 33 is mounted and overlaid with a seat cushion pad support 32 and a seat cushion pad 31, with the assembly being lined with a seat cushion trim cover 30. The seat back 22 comprises a seat back frame 44, on which a seat back spring 43 is mounted and overlaid with a combination of a seat back pad support 42 and a seat back pad 41, with the assembly being lined with a seat back trim cover 40.

Figure 2B:
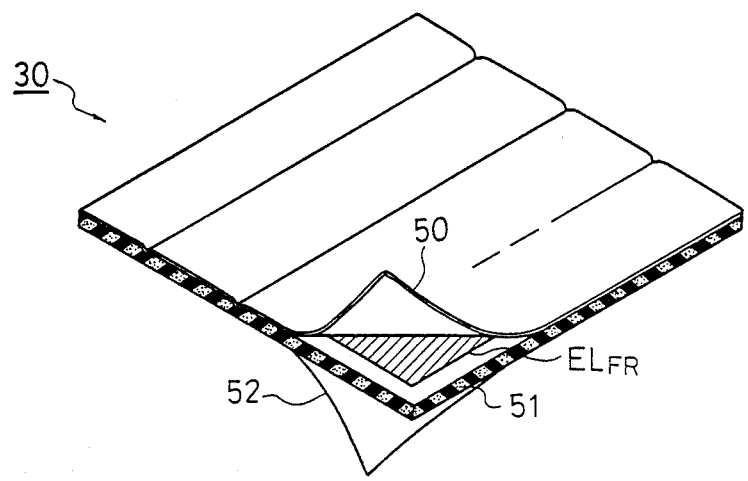
FIG. 2b is a perspective view of a seat cushion trim cover shown in FIG. 2a, part being broken away to indicate internal construction.

Referring to FIG. 2b which shows the construction of the seat cushion trim cover 30, it comprises, a skin 50, a wadding 51 and a wadding cover 52, which are assembled together into a single sheet. As shown hatched in FIG. 2b, the surface of the wadding 51 which bears against the rear or internal surface of the skin 50 is formed with a detecting electrode $EL_{FR}$, which is formed by sputtering an electrically conductive paint, in a region of the trim cover 30 which excludes the side supports 21.

Figure 3A:
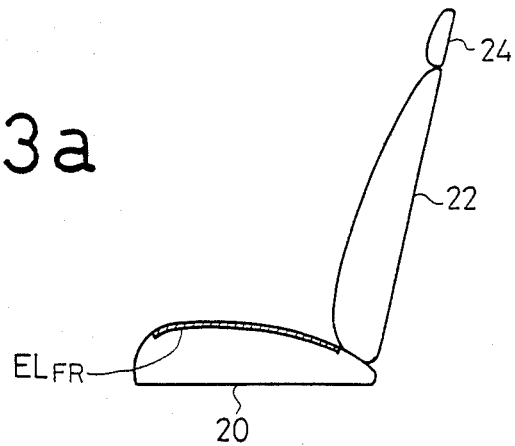
FIGS. 3a, 3b, 3c, 4a, 4b and 4c are side elevations and front views illustrating the layout of a detecting electrode assembled into a seat.
Figure 3B:
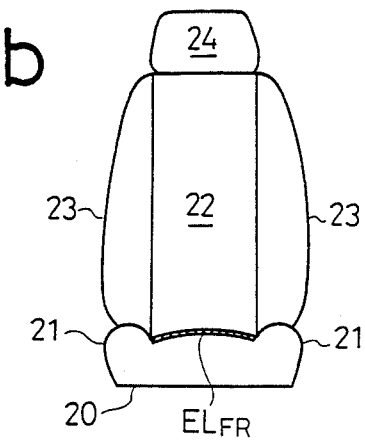

The seat $ST_{FR}$ of the present embodiment is illustrated in schematic side elevation in FIG. 3a and in a schematic front view in FIG. 3b, and it will be noted from these Figures that the detecting electrode $EL_{FR}$ is applied to the seat cushion 20 adjacent to the surface thereof over substantially the entire surface where an occupant may be seated upon.

Figure 1B:
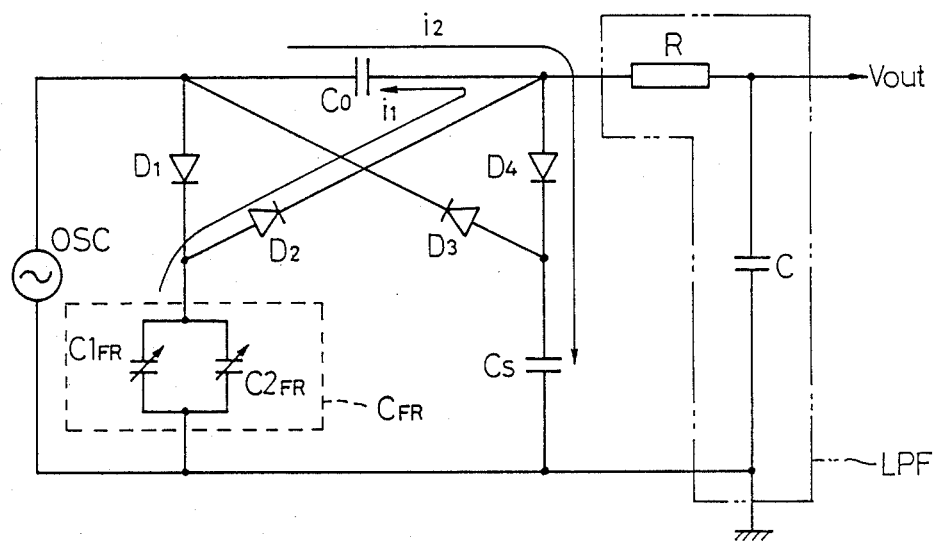
FIG. 1b is a circuit diagram of a detector circuit shown in FIG. 1a, illustrating the operation thereof.

Referring to FIG. 1b, the operation of the detector circuit $DET_{FR}$ which detects a change in the capacitance of the capacitor $C_{FR}$ will now be described. It is to be understood in FIG. 1b that the occupant detecting capacitor $C_{FR}$ is illustrated as an equivalent variable capacitor, the capacitance of which varies with the presence or absence of a man MAN.

An oscillator OSC produces a sinusoidal alternating voltage having a symmetrical waveform for its positive and negative polarity. It should be understood that the oscillator may produce a triangular or rectangular wave provided the symmetry for the positive and the negative polarity is maintained. In addition, the circuit includes a reference capacitor Cs, a storage capacitor Co, a low pass filter comprising a resistor R and a capacitor C, and diodes $D_1$, $D_2$, $D_3$ and $D_4$. The capacitor Cs has a value which is chosen equal to the capacitance of the occupant detecting capacitor $C_{FR}$ when a man MAN is not seated upon the FR seat.

In operation, the capacitors $C_{FR}$, Co and Cs are repeatedly charged and discharged for each positive and negative cycle of the sinusoidal alternating voltage which is output from the oscillator OCS. Considering the storage capacitor Co, the current which passes through the capacitor Co is indicated as $i_1$ and $i_2$ in FIG. 1b. During the negative half cycle of the sinusoidal output voltage from the oscillator OCS, the current $i_1$ passes through the diode $D_2$ to charge the capacitor $C_{FR}$ while the current $i_2$ passes through the diode $D_4$ to charge the capacitor Cs during the positive half cycle of the sinusoidal output voltage from the oscillator OSC. It will be seen that $i_2=i_2$ if $C_{FR}=Cs$. Since the direction of current flow is opposite, the capacitor Co will be charged and discharged to the same extent, and accordingly there shoudl appear no voltage thereacross. However, if $C_{FR} \neq Cs$, it follows that $i_1 \neq i_2$, whereby the capacitor Co will be charged in one direction to produce a voltage thereacross.

Figure 1C:
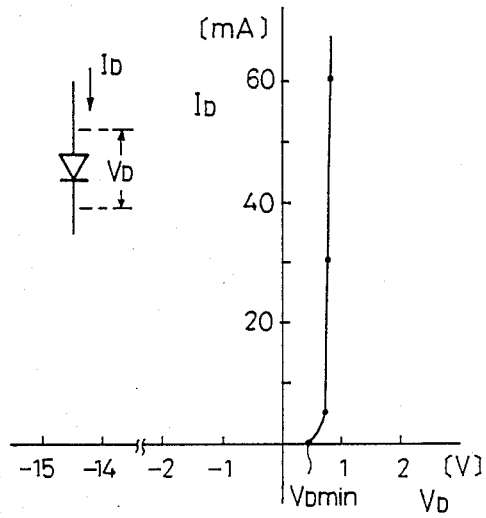
FIG. 1c graphically shows a diode response.

It will be understood that the storage capacitor Co is short-circuited by a combination of the diodes $D_1$ and $D_2$ or alternatively by a combination of the diodes $D_4$ and $D_3$, so that theoretically there will be no voltage output across the capacitor Co. However, referring to FIG. 1c which graphically shows the forward current $I_D$ plotted against the forward voltage of a diode, it will be seen that there is no flow of the current $I_D$ for a voltage equal to or less than a forward critical voltage $V_{Dmin}$. Hence, in the detector circuit $DET_{FR}$ of the present embodiment, the voltage which is developed across the storage capacitor Co due to any difference between the capacitors $C_{FR}$ and Cs is chosen to be equal or less than the forward critical voltage $V_{Dmin}$. In this manner, the terminal voltage across the capacitor Co is derived as a d.c. voltage Vout through the low pass filter LPF. Thus, the detector circuit $DET_{FR}$ outputs a positive d.c. voltage Vout when an occupant MAN has seated upon the FR seat to increase the capacitance of the occupant detecting capacitor $C_{FR}$ to an extent such that $Cs < C_{FR}$.

The d.c. amplifier AMP shown in FIG. 1a amplifies the output voltage Vout from the detector circuit $DET_{FR}$, and the amplified output is converted into a binary value by the digitizer BIN which compares the amplifier output against a given threshold value. The threshold value is chosen to be slightly greater than an output value from the amplifier AMP resulting from the capacitance of the capacitor $C_{FR}$ in a steady state condition when no man MAN is seated upon the FR seat in order to prevent a hunting operation, it being understood that there is a small output from the amplifier if $Cs=C_{FR}$ in view of a difficulty of choosing such value in Cs. In this manner, the digitizer provides an output of "0" (L level) indicating the presence of an occupant and an output of "1" (H level) indicating the absence of an occupant.

Figure 5A:
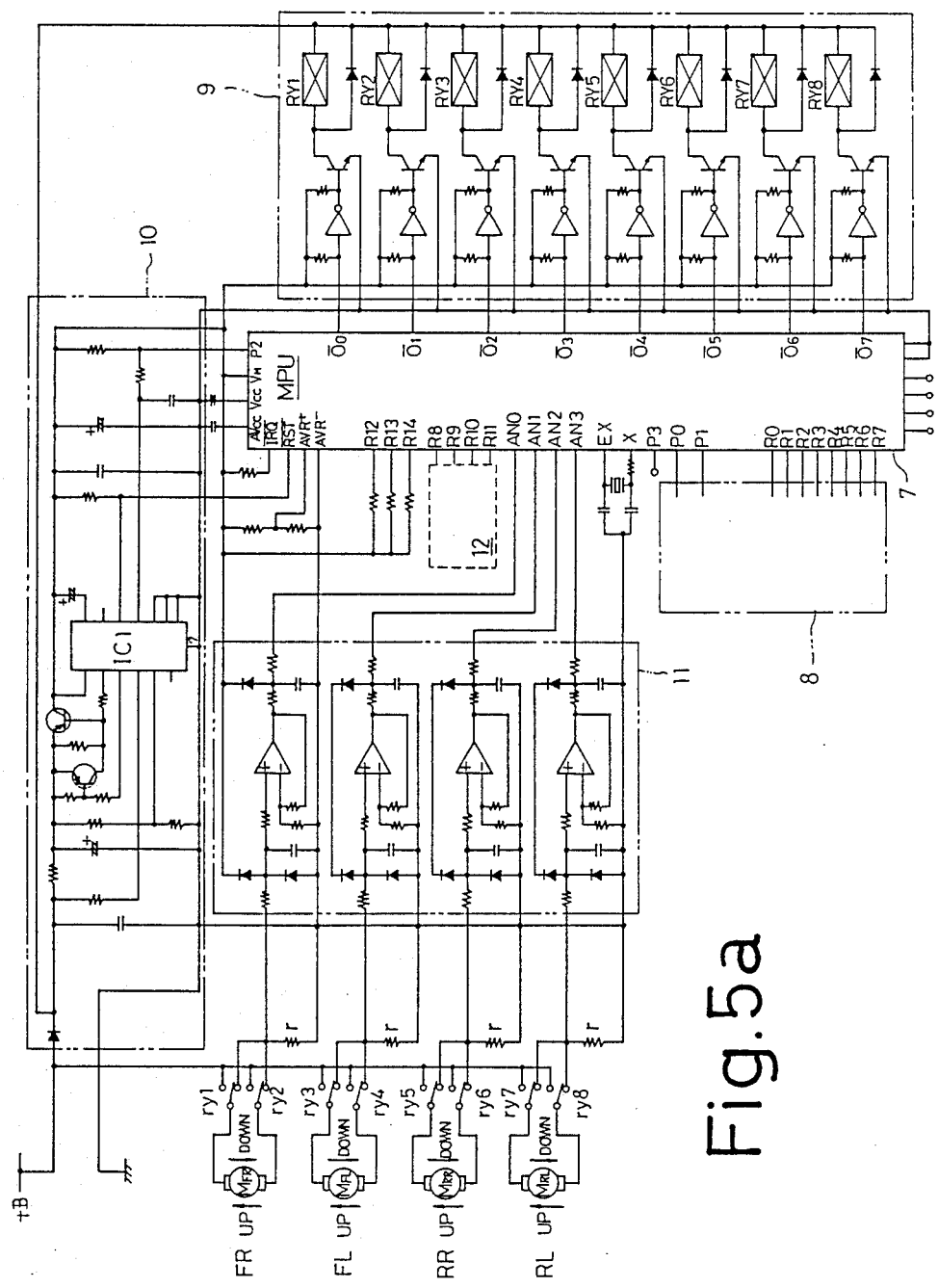
FIG. 5a is a circuit diagram of a power operated window control system of a vehicle in which the embodiment shown in FIG. 1a is incorporated.

FIG. 5a shows the general arrangement of a power operated window control system for a vehicle in which the occupant detector of the invention is incorporated. As shown, the system essentially comprises a microcomputer (MPU) 7, an input switch circuit 8, a drive circuit 9, a power supply circuit 10, a current detector circuit 11 and an occupant detector 12. In the description to follow, certain abbreviations are used consistently that "FR . . . " or " . . . $_{FR}$" refer to a component associated with the FR seat, "FL . . . " or " . . . $_{FL}$" refer to a component associated with an FL seat which is located alongside the assistant driver's or front left-hand seat, "RR . . . " or " . . . $_{RR}$" refers to a component associated with an RR seat which is located directly behind driver's seat or rear right-hand seat, and "RL . . . " or " . . . $_{RL}$" refers to a component associated with an RL seat which is located directly behind the assistant driver's seat or rear left-hand seat.

Figure 5B:
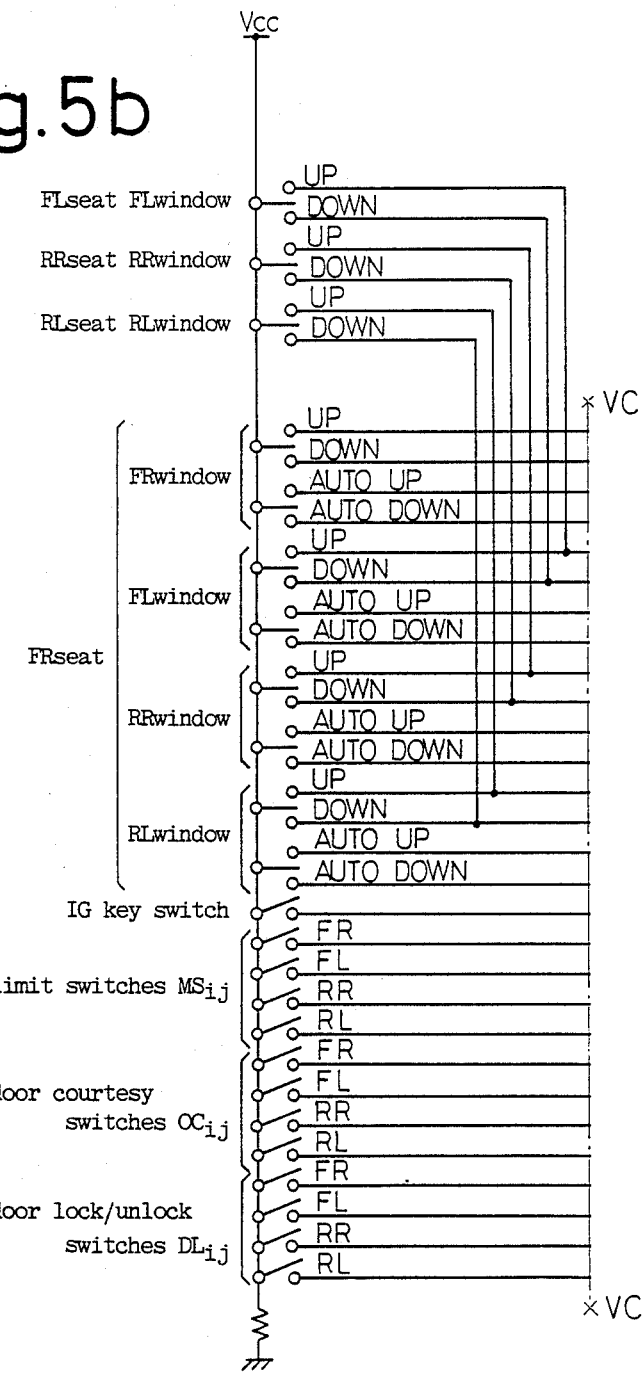
Figure 5C:
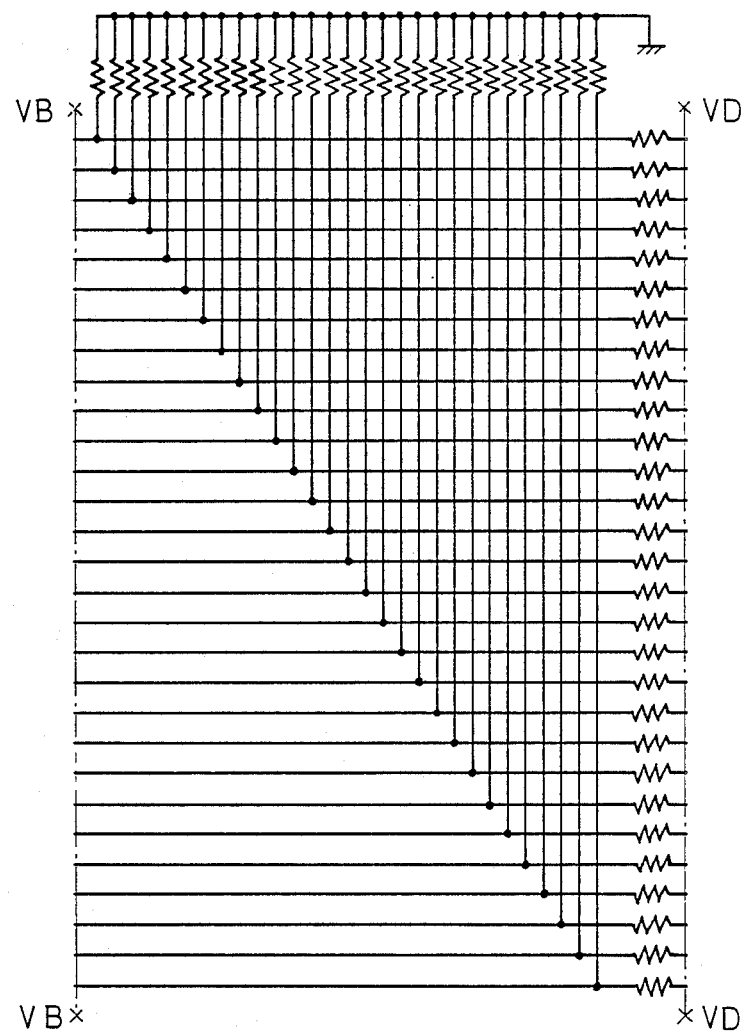
Figure 5D:
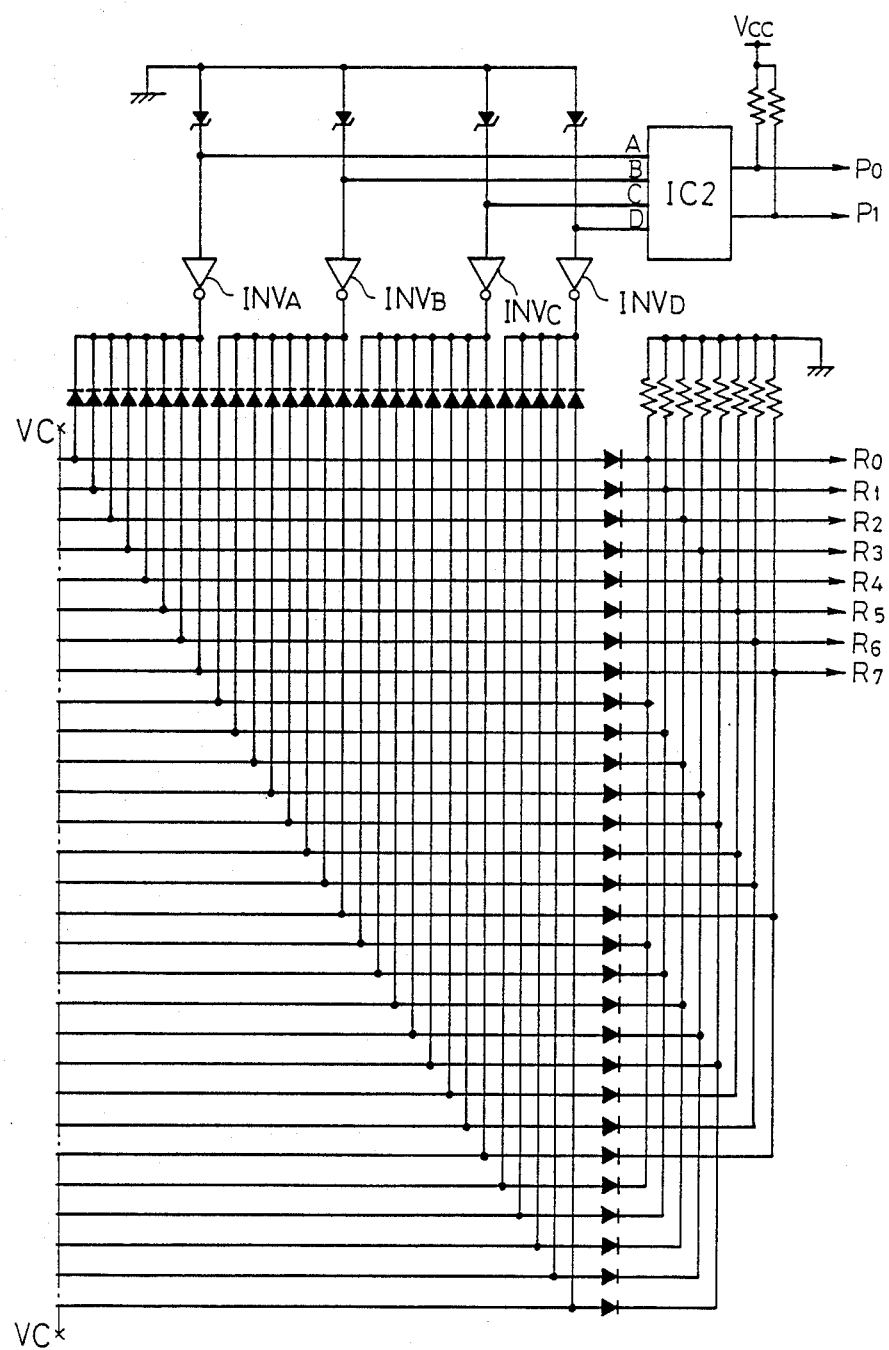

MPU 7 includes input ports R0 to R7 and output ports P0 and P1, all of which are connected to the input switch circuit 8. The detail of the input switch circuit 8 is shown in FIGS. 5b, 5c and 5d, which are combined together into a single drawing by joining the line VC—VC shown in FIG. 5b with a line VB—VB shown in FIG. 5c and joining the line VD—VD shown in FIG. 5c with a line VC—VC shown in FIG. 5d. The input switch circuit 8 is connected to a number of switches including up/down switches and automatic up/down switches associated with the FR window, FL window, RR window and RL window; limit switches $MS_{FR}$, $MS_{FL}$ (see FIG. 6c), $MS_{RR}$, $MS_{RL}$ which detect the position of the glass pane of the FR window, FL window, RR window and RL window; door courtesy switches $OC_{FR}$, $OC_{FL}$, $OC_{RR}$, $OC_{RL}$ which detect the opening or closing of the FR door, FL door, RR door and RL door; door lock/unlock detecting switches $DL_{FR}$, $DL_{FL}$, $DL_{RR}$, $DL_{RL}$ for the FR door, FL door, RR door and RL door; and an IG key switch which detects the presence or absence of an ignition key which may inserted into a corresponding receptacle, not shown. It is to be noted that in FIG. 5b, limit switches are indicated by $MS_{ij}$, door courtey switches are indicated by $OC_{ij}$, and door lock/unlock switches are indicated by $DL_{ij}$ where the suffix i refers to either F or R while the suffix j refers to either R or L.

The input switch circuit includes a decoder IC2 which is connected to the output ports P0 and P1 of the microcomputer (MPU) 7 for selectively establishing "0" (L level) at one of output terminals A to D in accordance with the signals on the ports P0 and P1, presenting "1" (H level) elsewhere. The relationship between the inputs and outputs are indicated in the Table 1 below.

TABLE 1

| inputs | | outputs | | | |
|---|---|---|---|---|---|
| P0 | P1 | A | B | C | D |
| 0 | 0 | 0 | 1 | 1 | 1 |
| 0 | 1 | 1 | 0 | 1 | 1 |
| 1 | 0 | 1 | 1 | 0 | 1 |
| 1 | 1 | 1 | 1 | 1 | 1 |

The outputs on the output terminals A to D are inverted by inverters $INV_A$ to $INV_D$. When the output from one of these inverters assumes its H level ("0"), a junction of the inverter with a switch having its stationary contact connected to its movable contact will assume its H level ("1") while a junction with a switch having its stationary contact which assumes its L level ("0") will assume its H level ("0"). Conversely, when the output from the inverter assumes its L level ("0"), its junction with a switch remains at its L level ("0") if the stationary contact of the switch is connected to its movable contact to assume its H level ("1") since the corresponding diode conducts. In this manner, MPU 7 reads the status of 29 switches in the input switch circuit through seven input ports R0 to R7, by changing the level at the output ports P0 and P1.

By way of example, connected to the common input port R0 are UP contact (stationary contact: The same assumption being made in the following description) of the FR window up/down switch, UP contact of the RR window up/down switch, the contact of the IG key switch and the contact of the RL door courtesy switch $OC_{RL}$ in the input switch circuit 8. When the both output ports P0 and P1 assume "0", only the output from the inverter $INV_A$ will assume its H level ("1"), so that the FR window up operation or the on/off status of the UP contact can be read.

Returning to FIG. 5a, the microcomputer (MPU) 7 includes output ports O0 to O8, which are connected to relay drivers of the drive circuit 9. Each relay driver comprises an inverter and a switching transistor, and is arranged such that when an output port assumes its L level ("0"), such level is inverted by the inverter to render the switching transistor conductive, thereby energizing one of relays RY1 to RY8 which is connected thereto.

When the output port O0 assumes its L level ("0") to energize the relay RY1, its relay contact ry1 is closed, connecting a motor $M_{FR}$ for elevating the FR window to the +B supply to induce a current flow indicated by an arrow DOWN, thus energizing the motor $M_{FR}$ for rotation in the reverse direction. When the output port O1 assumes its L level ("0") to energize the relay RY2, its contact ry2 is closed, connecting the motor $M_{FR}$ to +B supply to induce a current flow through the motor in a direction indicated by an arrow UP, thus energizing it for rotation in the forward direction. Similarly, relay RY3 or RY4 can be selectively energized for energizing a motor $M_{FL}$ for elevating the FL window for rotation in either forward or reverse direction; relay RY5 or RY6 can be selectively energized for energizing a motor $M_{RR}$ for elevating the RR window for rotation in either forward or reverse direction; relay RY7 or RY8 can be selectively energized for energizing a motor $M_{RL}$ for elevating the RL window for rotation in forward or reverse direction.

Figure 6A:
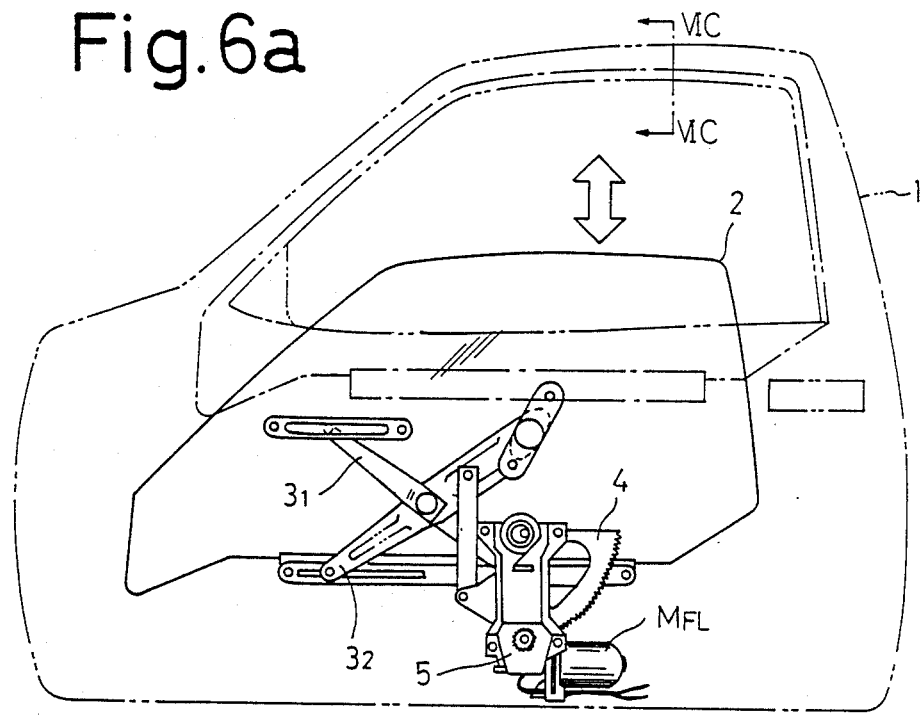
FIG. 6a is a side elevation of a mechanism for a window located alongside an assistant driver's seat of a vehicle.
Figure 6B:
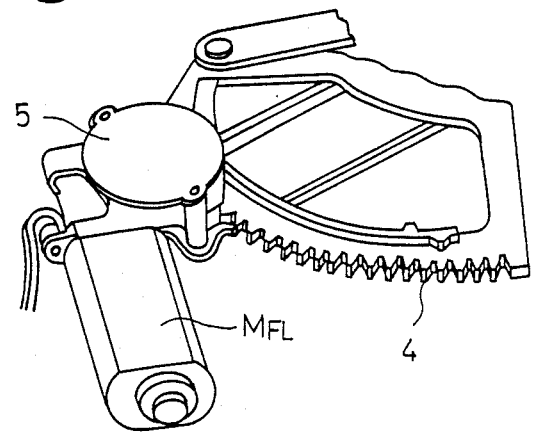
Figure 6C:
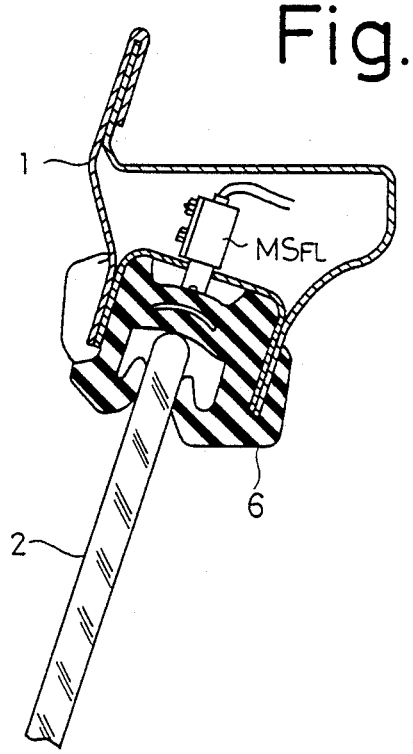

Referring to FIGS. 6a, 6b and 6c, a window elevating mechanism will be described. FIG. 6a shows a motor driven mechanism which elevates a glass pane (FL window) 2 associated with the FL door 1 up and down. In this Figure, a pair of upper and lower guide rails are secured to the glass pane 2, and are engaged by pins mounted on one end of link arms $3_1$, $3_2$. An elevating arm which is engaged with the other end of the link arm $3_2$ is driven by a sector-shaped gear 4 coupled thereto, up and down. The sector-shaped gear 4 is in mesh-ing engagement with a wheel of a worm wheel assembly 5, the worm of which is in meshing engagement with the wheel and is coupled to the rotary shaft of the motor $M_{FL}$. A combination of the sector-shaped gear 4 and the worm wheel assembly 5 is illustrated in FIG. 6b. When the motor $M_{FL}$ rotates in the forward direction, such rotation is transmitted through the worm wheel assembly 5 to rotate the sector-shaped gear 4 clockwise, as viewed in FIG. 6a, thus raising the glass pane 2 upward (thus closing the window). When the motor $M_{FL}$ rotates in the reverse direction, the rotation is transmitted through the worm wheel assembly 5 to rotate the sector-shaped gear 4 counter-clockwise, as viewed in FIG. 6a, thus lowering the glass pane 2 (thus opening the window).

FIG. 6c shows the cross section taken along the line VIC—VIC shown in FIG. 6a. As shown, the position detecting limit switch $MS_{FL}$ is disposed in a hollow space within the top end of the door frame. The switch $MS_{FL}$ has a movable contact which projects through the door frame toward a weather strip 6, and when the glass pane 2 reaches its upper limit position, the weather strip 6 is flexed to abut against the movable contact, thus turning the switch $MS_{FL}$ on. Accordingly, the switch $MS_{FL}$ remains off as long as the glass pane 2 is located below the upper limit position. While the window elevating mechanism associated with the FL door 1 alone has been illustrated, it should be understood that other doors are similarly constructed.

Again returning to FIG. 5a, a current detector circuit is connected to the supply bus of each window elevating motor. As is well known, a motor current is proportional to the magnitude of a load on the motor, so that the motor current through any elevating motor ($M_{FR}$, $M_{Fl}$, $M_{RR}$, $M_{RL}$) is detected in terms of a voltage drop across a resistor r. Thus the motor will be overloaded at the lower limit position of the glass pane which it drives, whereby the full opening of the window can be detected.

Figure 5E:
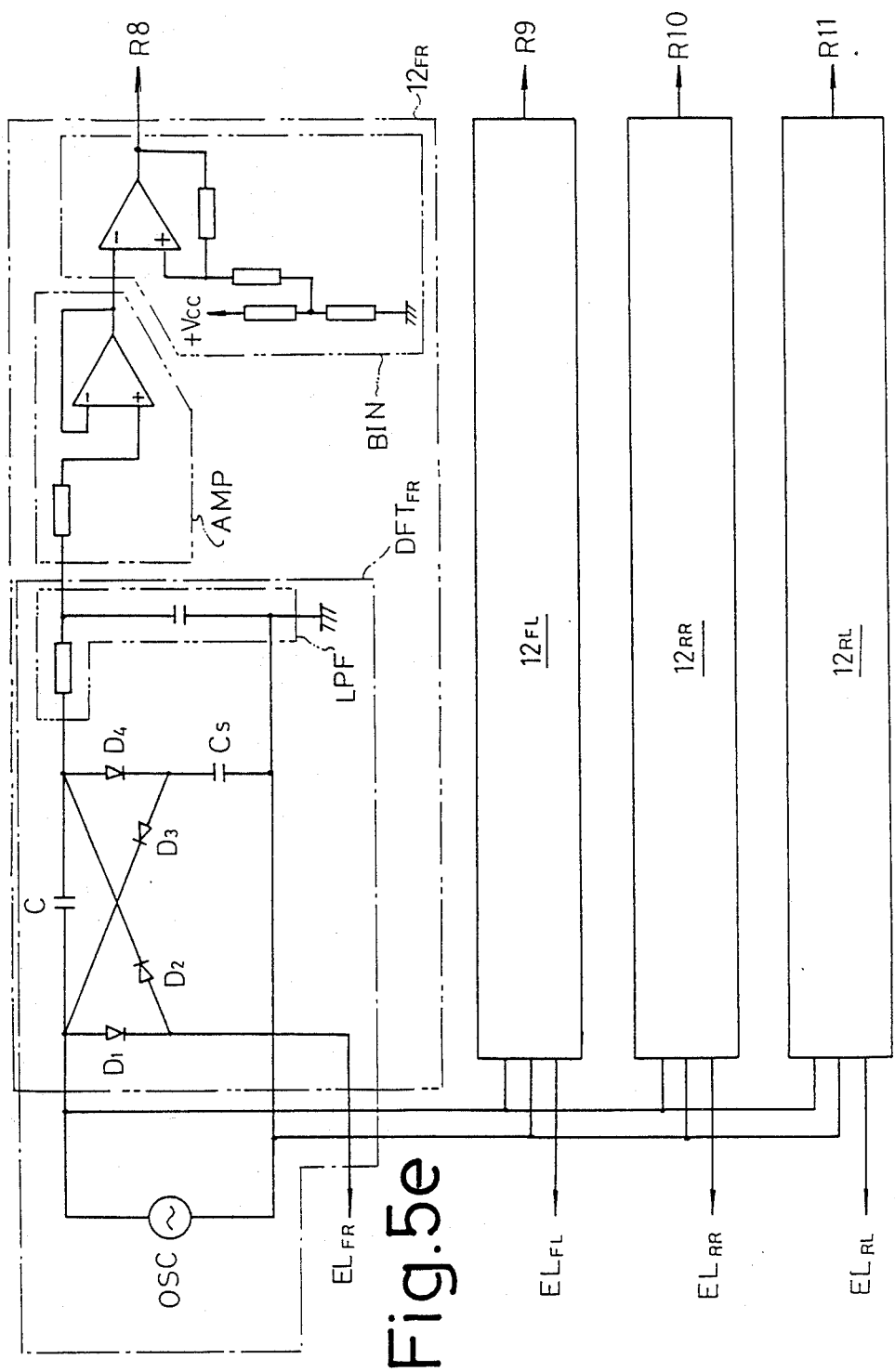

The occupant detector 12 detects the presence or absence of an occupant on any of the FR seat, FL seat, RR seat and RL seat. As illustrated in FIG. 5e, the detector 12 comprises four identical blocks $12_{FR}$, $12_{FL}$, $12_{RR}$ and $12_{RL}$, and a single oscillator OSC is common to all of these blocks. Each of these blocks is arranged and functions in the same manner as described above in connection with FIG. 1a. Again, resistors are indicated by rectangles.

The electrodes $EL_{FR}$, $EL_{FL}$, $EL_{RR}$ and $EL_{RL}$ are mounted on the seat cushion (not shown) of the FR, FL, RR and RL seats, where an occupant may be seated and are connected to detecting terminals of corresponding blocks. A signal which is equal to "0" when an occupant is present and which assumes "1" if no occupant is present, as derived for each of the seats, is applied to input ports R8, R9, R10 and R11 of MPU 7.

Figure 7:
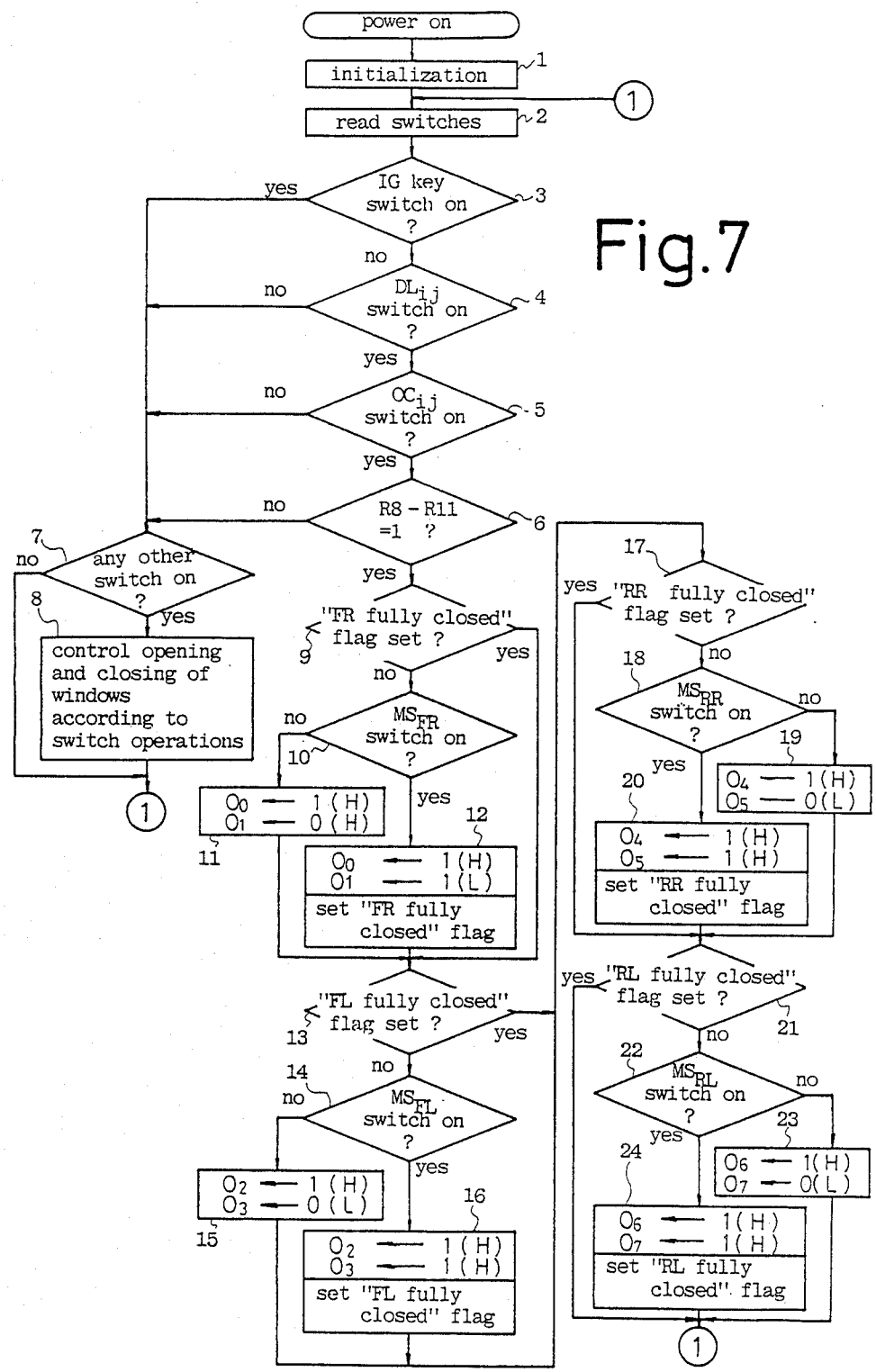

MPU 7 controls the FR, FL, RR and RL windows in the following manner. Specifically, as an up switch of each window is operated, the corresponding window is driven in the closing direction for a time interval during which the switch remains on. As each down switch of the window is operated, the corresponding window is driven in the opening direction for a time interval during which the switch remains on. When an automatic up switch of a window is operated, the corresponding window is driven until it is fully closed. Similarly, when an automatic down switch of a window is operated, the corresponding window is driven until it is fully open. If the absence of an occupant as well as a given condition of the vehicle (a condition representing the completion of its use) are detected, any open window are driven until they are fully closed, thus preventing a failure to close the window. FIG. 7 shows a flowchart which illustrates the operation of MPU 7 which essentially comprises a control operation to prevent a failure to close the window or windows. In the following description of FIG. 7, a denotation "S . . . " represents the number of a step in the program, even though "S" is not indicated in the flowcharts.

When the system is connected to a battery onboard the vehicle and the power is turned on, registers, flags and memories are initialized at S1. The status of individual switches are read at S2 in the manner mentioned previously. If it is found at S3 that the IG key switch is on, the program proceeds to S7 and S8, thus controlling the opening or closing of the individual windows in accordance with the switch operations. When the FR window is fully closed, an "FR fully closed" flag is set; when the FL window is fully closed, an "FL fully closed" flag is set; when the RR window is fully closed, an "RR fully closed" flag is set; and when the RL window is fully closed, an "RL fully closed" flag is set.

A driver and his cooccupant leave the vehicle at the end of the use of the vehicle after he has withdrawn the ignition key (IG key switch off), locked all the doors (all the door lock switches on), and closed all the doors (all of the door courtesy switches on). Accordingly, the program proceeds through S3, S4, S5 and S6 and then proceeds to S9 if the input ports R8 to R11 assume "1", indicating that there is no occupant on any seat.

The FR fully closed flag is examined at S9. If this flag is set, this means that the FR window has already been fully closed, and hence the program proceeds to S13. If this flag is not set, this means that the FR window is not still fully closed, and accordingly the status of the switch $MS_{FR}$ is examined at S10. Since the FR window is not fully closed, the switch $MS_{FR}$ is obviously off, whereby "1" (H) and "0" (L) are delivered to the output ports 00 and 01, respectively, at S11, thus energizing the motor $M_{FR}$ for rotation in the forward direction to drive the FR window in the closing direction.

Subsequently, when the FR window has been fully closed, after the program has proceeded through a loop including S11-S13 ... S17 ... S21 ... S2-S3-S4-S5-S-6-S9-S10-S11-S13 ..., the switch $MS_{FR}$ is turned on, whereupon the program proceeds from S10 to S12 where "1" (H) are delivered to the both output ports 00 and 01, thus deenergizing the motor $M_{FR}$ and setting the FR fully closed flag. After the FR fully closed flag has been set, the program proceeds from S9 to S13.

The FL fully closed flag is examined at S13. If this flag is set, this means that the FL window has already been fully closed, and accordingly the program proceeds to S17. If this flag is not set, this means that the FL window has not yet been fully closed, and accordingly the status of the switch $MS_{FL}$ is examined at S14. Since the FL window is not fully closed, the switch $MS_{FL}$ is obviously off, whereby "1" (H) and "0" (L) are delivered to the output ports 02 and 03, respectively, at S15, thus energizing the motor $M_{FL}$ for rotation in the forward direction to drive the FL window in the closing direction. When the FL window has become fully closed after the program has proceeded through a loop including S15-S17 ... S21 ... S2-S3-S4-S5-S6-S9 ... S13-S14-S15-S17 ..., the switch $MS_{FL}$ is turned on, whereupon the program proceeds from S14 to S16 where "1" (H) is delivered to the both output ports 02 and 03, thus deenergizing the motor $M_{FL}$ and setting the FL fully closed flag. After the FL fully closed flag has been set, the program proceeds from S13 to S17.

The RR fully closed flag is examined at S17. If the flag is set, this means that the RR window has already been fully closed, and accordingly the program proceeds to S21. However, if the flag is not set, this means that the RR window has not yet been fully closed, and accordingly the status of the switch $MS_{RR}$ is examined at S18. Since the RR window is not fully closed, the switch $MS_{RR}$ is obviously off, whereby "1" (H) and "0" (L) are delivered to the output ports 04 and 05, respectively, at S19, thus energizing the motor $M_{RR}$ for rotation in the forward direction to drive the RR window in the closing direction. When the RR window has become fully closed after the program has proceeded through a loop including S19-S21 ... S2-S3-S4-S5-S-6-S9 ... S13-S17-S18-S19-S21 ..., the switch $MS_{RR}$ is turned on, whereupon the program proceeds from S18 to S20 where "1" (H) are delivered to the both output ports 04 and 05, thus deenergizing the motor $M_{RR}$ and setting the RR fully closed flag. After the RR fully closed flag has been set, the program proceeds from S17 to S21.

The RL fully closed flag is examined at S21. If this flag is set, this indicates that the RL window has already been fully closed, and hence the program returns to S2. However, if the flag is not set, this means that the RL window has not yet been fully closed, and accordingly the status of the switch $MS_{RL}$ is examined at S22. Since the RL window is not fully closed, the switch $MS_{RL}$ is obviously off, whereby "1" (H) and "0" (L) are delivered to the output ports 06 and 07, respectively, at S23, thus energizing the motor $M_{RL}$ for rotation in the forward direction to drive the RL window in the closing direction. When the RL window has become fully closed after the program has proceeded through a loop including S23-S2-S3-S4-S5-S6-S9 ... S13 ... S17 .. . S21-S22-S23-S2 ..., the switch $MS_{RL}$ is turned on, whereupon the program proceeds from S22 to S24 where "1" (H) are delivered to the both output ports 06 and 07, thus deenergizing the motor $M_{RL}$ and setting the RL fully closed flag. After the RL fully closed flag has been set, the program proceeds from S21 to S2. MPU 7 controls the closing or opening of the individual windows of the vehicle in the manner mentioned above.

Figure 3C:
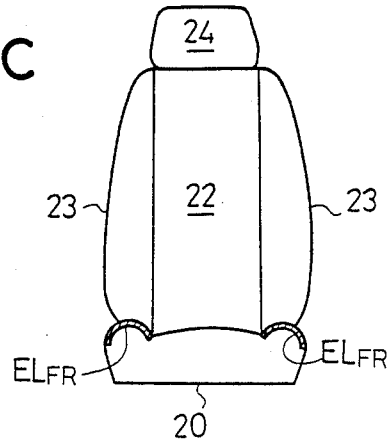
Figure 4A:
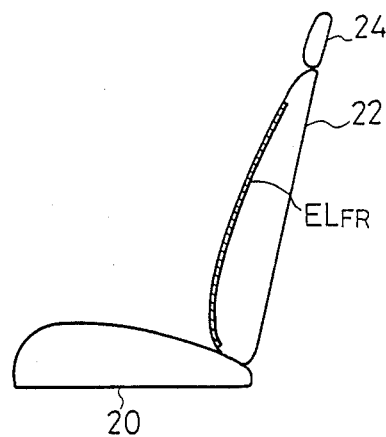
Figure 4B:
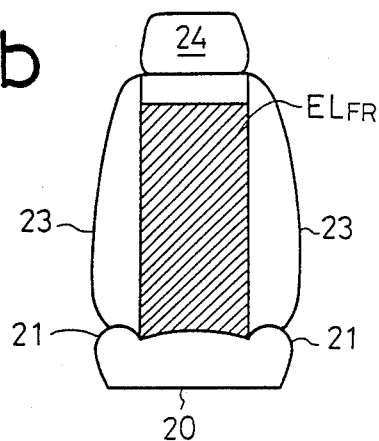
Figure 4C:
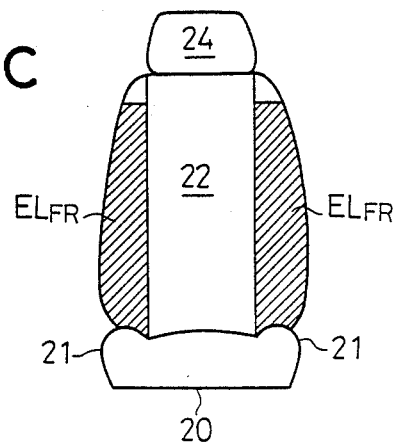

In the first embodiment described above, the detecting electrode has been mounted in an area of the seat cushion which is seated upon by an occupant, but other locations of the detecting electrode may also be employed. FIG. 3c shows another location of the electrodes $EL_{FR}$ which is chosen to be on the side supports 21, namely, around the area seated upon by an occupant. FIG. 4a, which is a side elevation of the seat, shows a further example of the location of the electrode $EL_{FR}$ which is chosen to be alongside the seat back 22. In this instance, the location may be an area of the seat back 22, against which an occupant leans, as indicated in the front view of FIG. 4b, or alternatively the location may be along the side supports 23, namely, around an area of the seat back which is seated upon by an occupant, as indicated by the front view of FIG. 4c. Two or more electrodes may be employed which are disposed at a combination of these four locations, thus extending the detectable range associated with each seat. In such instance, the plurality of electrodes used may be connected in parallel to the detecting terminal of the detector circuit $DET_{FR}$, or each electrode may be separately associated with its own detector circuit $DET_{FR}$, d.c. amplifier AMP and digitizer BIN, so that output signals from the separate circuits may be passed through a logical OR to determine the presence or absence of an occupant.

In the embodiment described above, the electrode is formed by sputtering a conductive paint onto the wadding 51 of the seat cushion trim cover 20, but alternatively, it may also be formed by bonding an aluminium foil thereto or by the use of a fabric of conductive fibres to form the wadding cover 52.

Figure 1D:
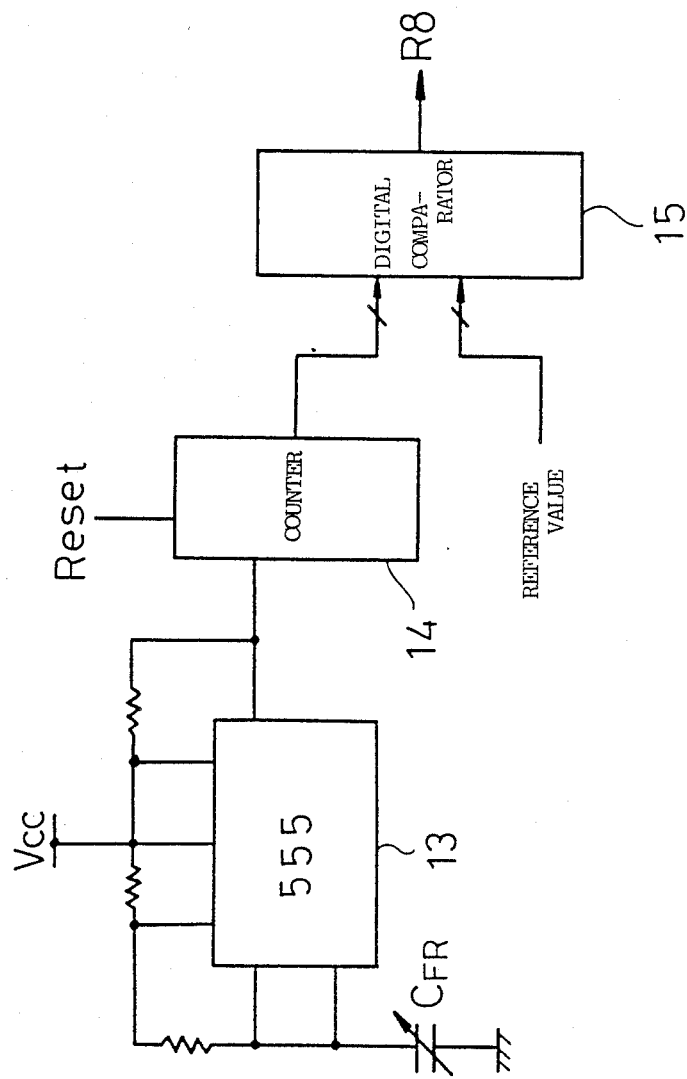
FIG. 1d is a block diagram of a modification of the first embodiment.

FIG. 1d shows another form of detector circuit and digitizer. In this modification, an oscillator, which may comprise IC 555 which is usually used as a timer, produces an oscillation signal of a frequency which depends on the capacitance of an external capacitor, with the frequency decreasing with an increasing capacitance of the capacitor. The signal developed by the oscillator 13 is counted by a counter 14, the count of which is compared against a reference value by a digital comparator 15. In this configuration, the occupant detecting capacitor $C_{FR}$ is connected as the external capacitor of the oscillator 13. Accordingly, when an occupant is seated upon the FR seat to increase the capacitance of the capacitor $C_{FR}$, the output frequency from the oscillator 13 reduces. The reference value is chosen to be slightly less than the output from the counter which results from the oscillation frequency of the oscillator 13 corresponding to the value of the occupant detecting capacitor $C_{FR}$ when an occupant MAN is not seated upon the FR seat, thus preventing a hunting phenomenon. By comparing the count from the counter 14 against the reference value, the comparator 15 outputs "1" signal indicating "the absence of an occupant" whenever the count exceeds the reference value, the outputs "0" signal indicating "the presence of an occupant" whenever the count is equal to or less than the reference value.

Figure 8:
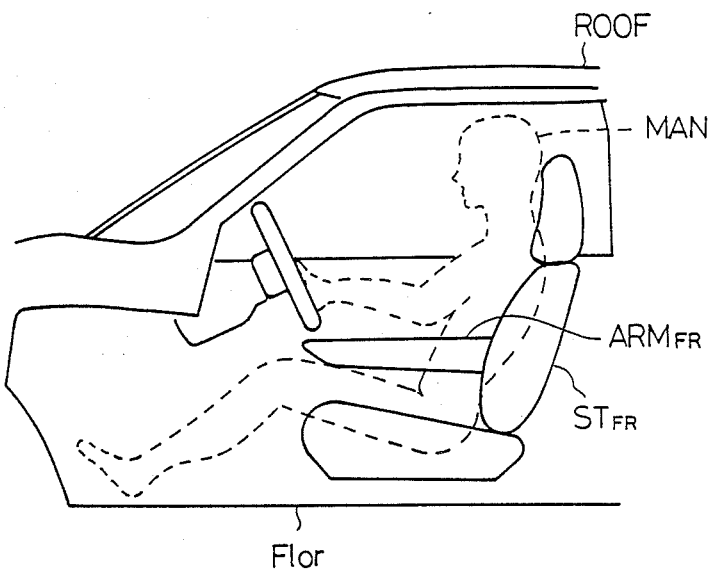
FIG. 8 is a fragmentary perspective view of a vehicle illustrating the disposition of an arm rest.

In a second embodiment of the invention, a detecting electrode is mounted on an arm rest of a vehicle. One example of such arrangement is shown in FIG. 8, which illustrates an FR arm rest $ARM_{FR}$. It will be seen that such arm rest is provided on each door to allow an occupant, who is a driver MAN in the example shown in FIG. 8, to place his arm, elbow or the like thereon.

Figure 9A:
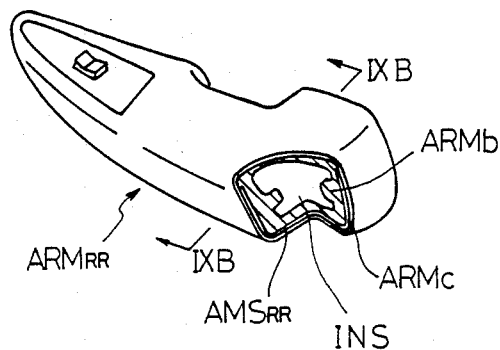
FIGS. 9a and 9b are a perspective view and a cross section of a second embodiment of the invention.
Figure 9B:
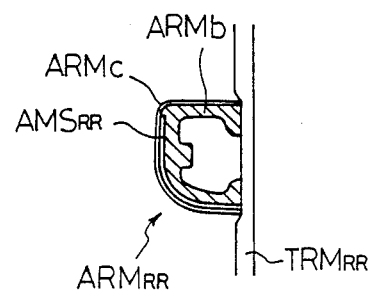

In this embodiment, an arm rest is formed by urethane foam. Such arm rest is formed by painting the inside of a urethane injection foam mold with a paste of vinyl chloride to define a skin (alternatively, a vinyl chloride shield may be vacuum molded), placing an insert or core material which is illustrated at INS in FIG. 9a, and by molding polypropyrene resin, ABS resin or the like, whereupon urethane foam is injected and formed. Thus, in the second embodiment, when the skin is formed, an aluminium foil is set in in conformity except for an area corresponding to the inside upper surface where an arm or elbow may be placed, before urethane foam is injected and foamed, thus assembling a detecting electrode therein. FIG. 9a shows a perspective view, partly broken away, of an RR arm rest $ARM_{RR}$ of this embodiment, while FIG. 9b is a cross section taken along the line VIIIB—VIIIB shown in FIG. 9a. As shown, a detecting electrode $AMS_{RR}$ of aluminium foil is held between an arm rest substrate $ARMb$ of urethane foam and an arm rest cover $ARMc$ of vinyl chloride, thus insulating the detecting electrode $AMS_{RR}$ from the electrical ground which is defined by the car body.

In the second embodiment, in the similar manner as the RR arm rest $ARM_{RR}$ shown in FIGS. 9a and 9b, other arm rests $ARM_{FR}$, $ARM_{FL}$ and $ARM_{RL}$ are assembled with detecting electrodes $AMS_{FR}$, $AMS_{FL}$ and $AMS_{RL}$, respectively, which are connected in place of the detecting electrodes $EL_{FR}$, $EL_{FL}$, $EL_{RR}$ and $EL_{RL}$ shown in the first embodiment of FIG. 5e. In this instance, the operation of the detector circuit, d.c. amplifier and digitizer as well as the operation of MPU 7 remains similar as mentioned above, and therefore will not be repeatedly described.

It is to be noted that the configuration of a detecting electrode which is assembled into the arm rest is not limited to the shape mentioned above. Various modifications will be described with reference to FIGS. 10a to 10l. It is to be noted that FIGS. 10a, 10c, 10e, 10g, 10i and 10k illustrate an arm rest of a vehicle in side elevations where the tapering end indicates the front of the vehicle or in the direction of forward movement of the vehicle while FIGS. 10b, 10d, 10f, 10h, 10j and 10l indicate a right-hand elevation. In these Figures, a hatching indicates an electrode assembled therein.

FIGS. 10a and 10b show a configuration 1 in which the rear portion of the arm rest is uniformly covered by the electrode over an area corresponding to two-thirds of the peripheral surface.

FIGS. 10c and 10d show a configuration 2 in which the rear portion of the arm rest is uniformly covered by the electrode over two-thirds the peripheral surface except for the upper surface.

FIGS. 10e and 10f show a configuration 3 in which the peripheral surface of the rear portion of the arm rest, corresponding to about two-thirds is covered by the electrode except for the upper surface, and in which several rectangular windows or cut-outs are formed in the electrode.

FIGS. 10g and 10h show a configuration 4 in which the peripheral surface of the arm rest, except for the upper surface is completely and uniformly covered by the electorde. The embodiment shown in FIGS. 9a and 9b correspond to this configuration.

FIGS. 10i and 10j show a configuration 5 in which the peripheral surface of the arm rest, except for the upper surface, is covered by the electrode and in which a pair of slits extending parallel to the upper surface are formed in the electrode.

The detecting electrodes having six different configurations as mentioned above have been connected to the detector circuit $DET_{FR}$ shown in FIG. 1a to produce output voltages Vout, which are listed in the Table 2 below. In this experiment, the oscillator OSC produces an oscillation output in the form of a sinusoidal alternating current having a peak-to-peak value of 20 volts. In the Table, a corresponds to a normal seating condition, b a driving condition, c a driver's attitude who lays himself upon the seat back which is then turned back, d a fully advanced position of the seat, e a fully retracted position of the seat, f an arm of a man which is inserted through the window to a point spaced 5 cm from the arm rest, g an arm inserted through the window to a point spaced 10 cm from the arm rest, h an arm inserted through the window to a point spaced 15 cm from the arm rest, i a seat condition which is turned forward without an occupant. In the Table, the output voltages are indicated in unit of volt.

TABLE 2

| Configuration | a | b | c | d | e | f | g | h | i |
|---|---|---|---|---|---|---|---|---|---|
| 1 | 0.60 | 0.40 | 0.36 | 0.60 | 0.52 | 0.36 | 0.20 | 0.08 | 0.00 |
| 2 | 0.60 | 0.36 | 0.56 | 0.50 | 0.40 | 0.32 | 0.22 | 0.10 | 0.08 |
| 3 | 0.30 | 0.22 | 0.22 | 0.36 | 0.24 | 0.28 | 0.14 | 0.08 | 0.04 |
| 4 | 0.50 | 0.20 | 0.28 | 0.54 | 0.42 | 0.20 | 0.12 | 0.08 | 0.04 |
| 5 | 0.44 | 0.32 | 0.32 | 0.68 | 0.40 | 0.20 | 0.10 | 0.04 | 0.02 |
| 6 | 0.36 | 0.32 | 0.20 | 0.56 | 0.32 | 0.24 | 0.14 | 0.10 | 0.06 |

In the embodiment shown in FIGS. 9a and 9b, an amplification factor of the d.c. amplifier AMP may be chosen to be equal to 65, whereby an output of 5.2 V is derived for the situation h and an output of 2.6 V is obtained for the situation i. Accordingly, by choosing a threshold of the digitizer BIN at 5 V, the situation i can be discriminated from the situations a, b, c, d, e, f and g shown the Table 2, thus allowing an effective detection of the presence or absence of a personnel.

It will be appreciated that the detecting electrode formed by the aluminium foil may be replaced by a conductive fabric. Alternatively, a conductive paint may be sputtered onto the inside of a skin which is formed within an urethane foam injection form mold to provide a detecting electrode. Also, a conductive paint may be sputtered onto the insert INS or the insert INS may be formed by a metal plate, thus providing a detecting electrode.

Figure 11A:
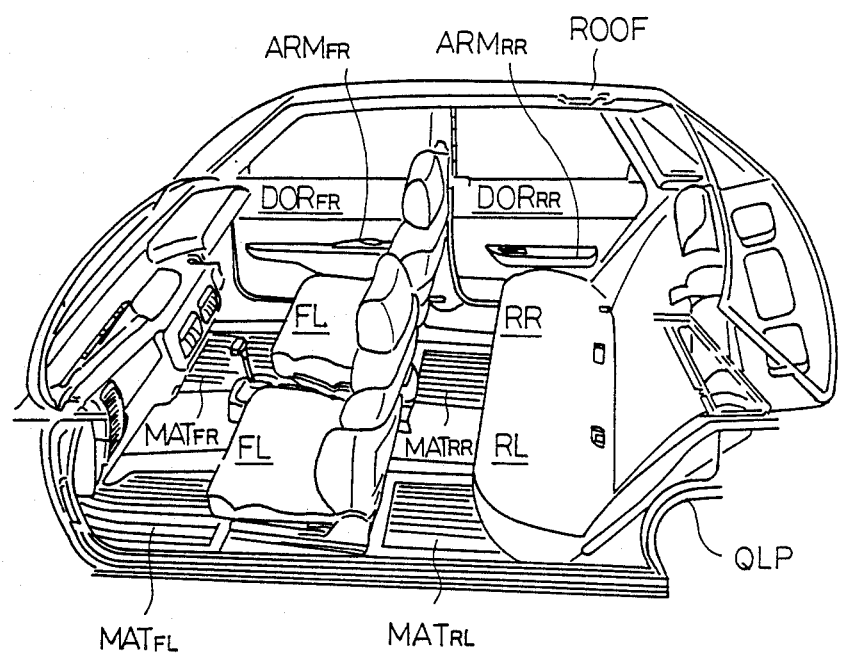
FIG. 11a is a perspective view looking into the interior of a vehicle.
Figure 11B:
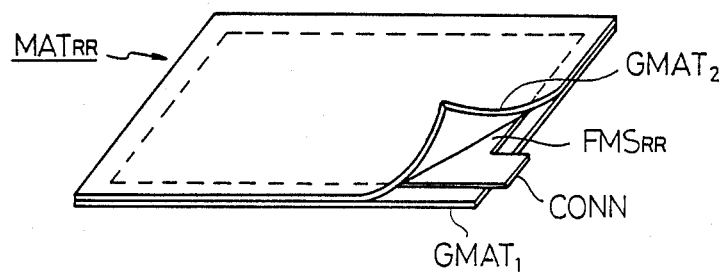
FIGS. 11b, 11c, 11d and 11e are perspective views of a third embodiment of the invention.

A third embodiment of the invention will now be described in which a detecting electrode is mounted on each floor mat of the vehicle. To avoid iteration, only a construction which is changed from the previous arrangements will be described. Referring to FIG. 11a, floor mats $MAT_{FR}$, $MAT_{FL}$, $MAT_{RR}$ and $MAT_{RL}$ are laid in front of and below the FR, FL, RR and RL seats, respectively. As an example, the construction of the floor mat $MAT_{RR}$ is illustrated in FIG. 11d. Referring to this Figure, the floor mat $MAT_{RR}$ comprises a pair of mat materials GMAT1 and GMAT2 between which a detecting electrode $FMS_{RR}$ of an aluminium foil is held. Thus, FIG. 11d shows a resulting three layer structure in perspective view. One end of the detecting electrode $FMS_{RR}$ is formed with a connection terminal CONN as shown in FIG. 11b. Other floor mats $MAT_{FR}$, $MAT_{FL}$ and $MAT_{RL}$ are constructed in the similar manner as the floor mat $MAT_{RR}$. Thus, each of the detecting electrodes $FMS_{FR}$, $FMS_{FL}$, $FMS_{RR}$ and $FMS_{RL}$ defines an occupant detecting capacitor by cooperating with an oppositely located roof ROOF, with a space including the FR, FL, RR and RL seats interposed therebetween. The connection terminal CONN of each detecting electrode is connected to the detecting terminal of a corresponding block of the occupant detector circuit shown in FIG. 5e.

Figure 11C:
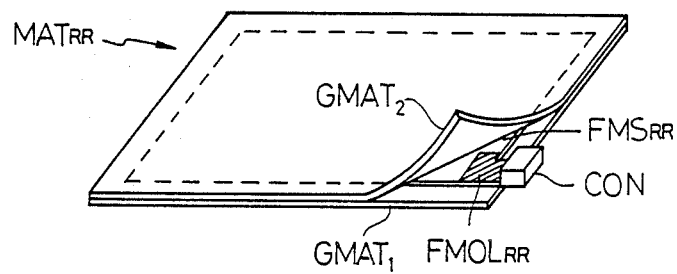
Figure 11D:
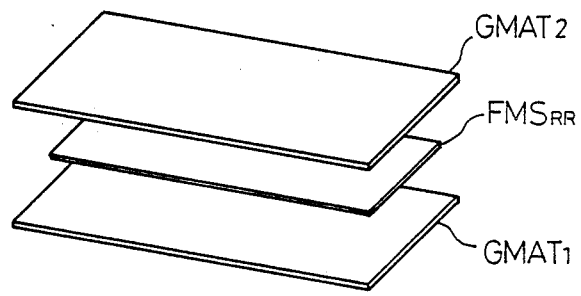

FIG. 11c shows a modification of the third embodiment in which the detector circuit $DETR_{RR}$ is molded on a part $FMOL_{RR}$, shown hatched, of the detecting electrode $FMS_{RR}$, and is connected to the remainder of the occupant detector circuit through a three pole connector CON.

Figure 11E:
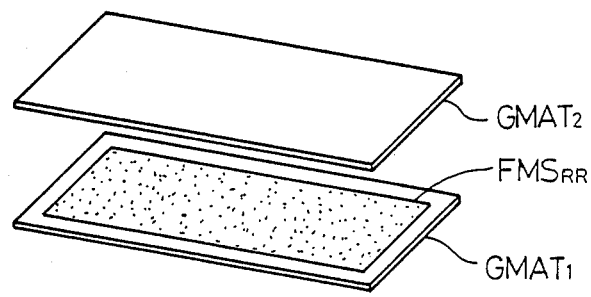

It is to be understood that the electrode which is assembled into the floor mat need not be constructed of an aluminium foil, but may comprise a conductive fabric or an electrode which is formed by sputtering a conductive paint on one of the mat materials, GMAT1, as indicated in FIG. 11e.

Figure 12A:
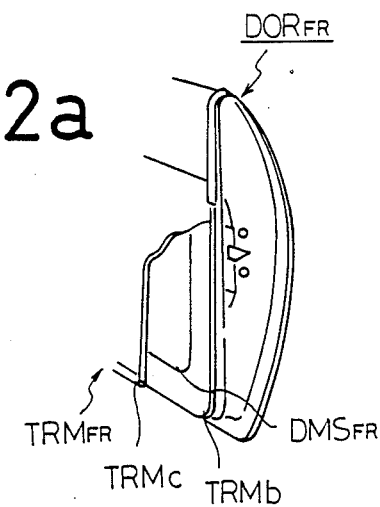
FIGS. 12a, 12b and 12c are perspective views and a front view of a fourth embodiment of the invention.
Figure 12B:
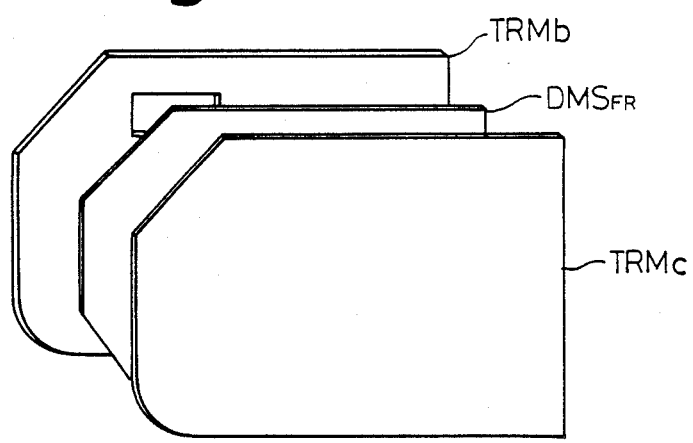
Figure 12C:
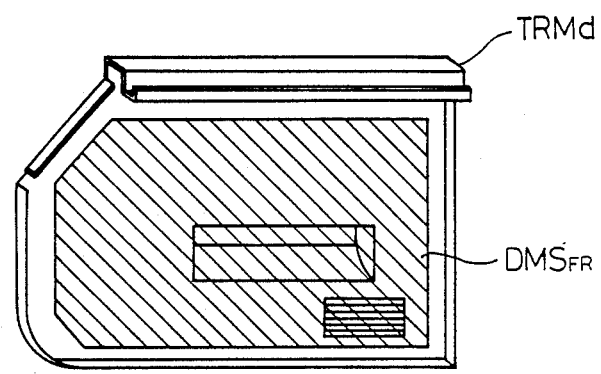

In a fourth embodiment of the invention, a detecting electrode is assembled into a door trim unit of a vehicle. Door trim units $TRM_{FR}$, $TRM_{FL}$, $TRM_{RR}$ and $TRM_{RL}$ are the lining of doors $DOR_{FR}$, $DOR_{FL}$, $DOR_{RR}$ and $DOR_{RL}$, respectively. By way of example, FIG. 12a shows the door trim $TRM_{FR}$ of the FR door $DOR_{FR}$ in a fragmentary cross section. In this Figure, the door trim $TRM_{FR}$ comprises a trim baseplate TRMb which is formed of a hardboard, to which a detecting electrode $DMS_{FR}$ of an aluminium foil is adhesively bonded, which is then bonded to and covered by a trim cover TRMc of a vinyl chloride sheet. Accordingly, FIG. 12b shows a resulting three layer structure in exploded view. One end of the detecting electrode $DMS_{FR}$ is formed with a connection terminal, not shown, which is similar to that illustrated in FIG. 11b. Other door trims $TRM_{FL}$, $TRM_{RR}$ and $TRM_{RL}$ are constructed in the similar manner as the door trim $TRM_{FR}$. In this manner, each of the detecting electrodes $DMS_{FR}$, $DMS_{FL}$, $DMS_{RR}$ and $DMS_{RL}$ is disposed opposite to the roof ROOF with a space containing FR, FL, RR and RL seats therebetween so as to define an occupant detecting capacitor. The connection terminal CONN of each detecting electrode is connected to the detecting terminal of a corresponding block of the occupant detector circuit shown in FIG. 5e. As before, the electrode which is assembled into the door trim need not be formed of an aluminium foil, but may comprise a metal plate, a conductive fabric or a conductive paint which is sputtered onto the inside of the trim baseplate TRMb which faces the door, as indicated in FIG. 12c.

Figure 13:
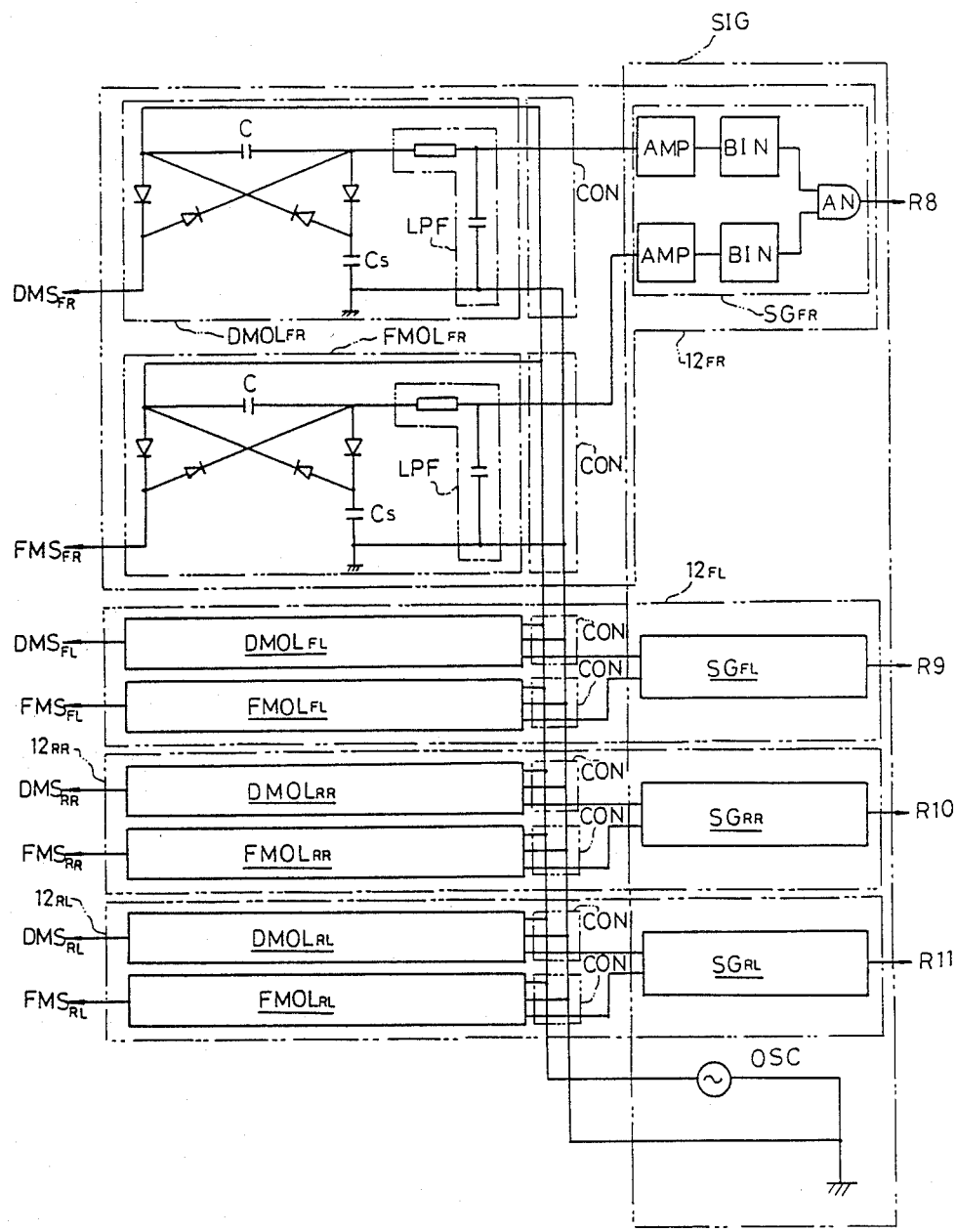
FIG. 13 is a block diagram of an occupant detector according to a fifth embodiment of the invention.

FIG. 13 shows a fifth embodiment of the invention in which each seat of the vehicle is associated with a pair of detecting electrodes. In the embodiment shown, the pair of electrodes comprises an electrode assembled into the floor mat and another electrode assembled into the door trim. As in the arrangement shown in FIG. 11c, part of the individual detecting electrodes is molded with a detector circuit, which is indicated by reference characters $DMOL_{FR}$, $FMOL_{FR}$, $DMOL_{FL}$, $FMOL_{FL}$, $DMOL_{RR}$, $FMOL_{RR}$, $DMOL_{RL}$ and $FMOL_{RL}$. Each detecting electrode is connected to an amplifier and digitizer SG through a three pole connector CON. The amplifier and digitizer SIG comprises four blocks $SG_{FR}$, $SG_{FL}$, $SG_{RR}$ and $SG_{RL}$, which are constructed in an identical manner. Each block includes a pair of d.c. amplifiers AMP and a digitizer BIN, which are identical to those shown in FIG. 1a. Outputs from the individual digitizers BIN are input to AND gate AN.

Figure 14A:
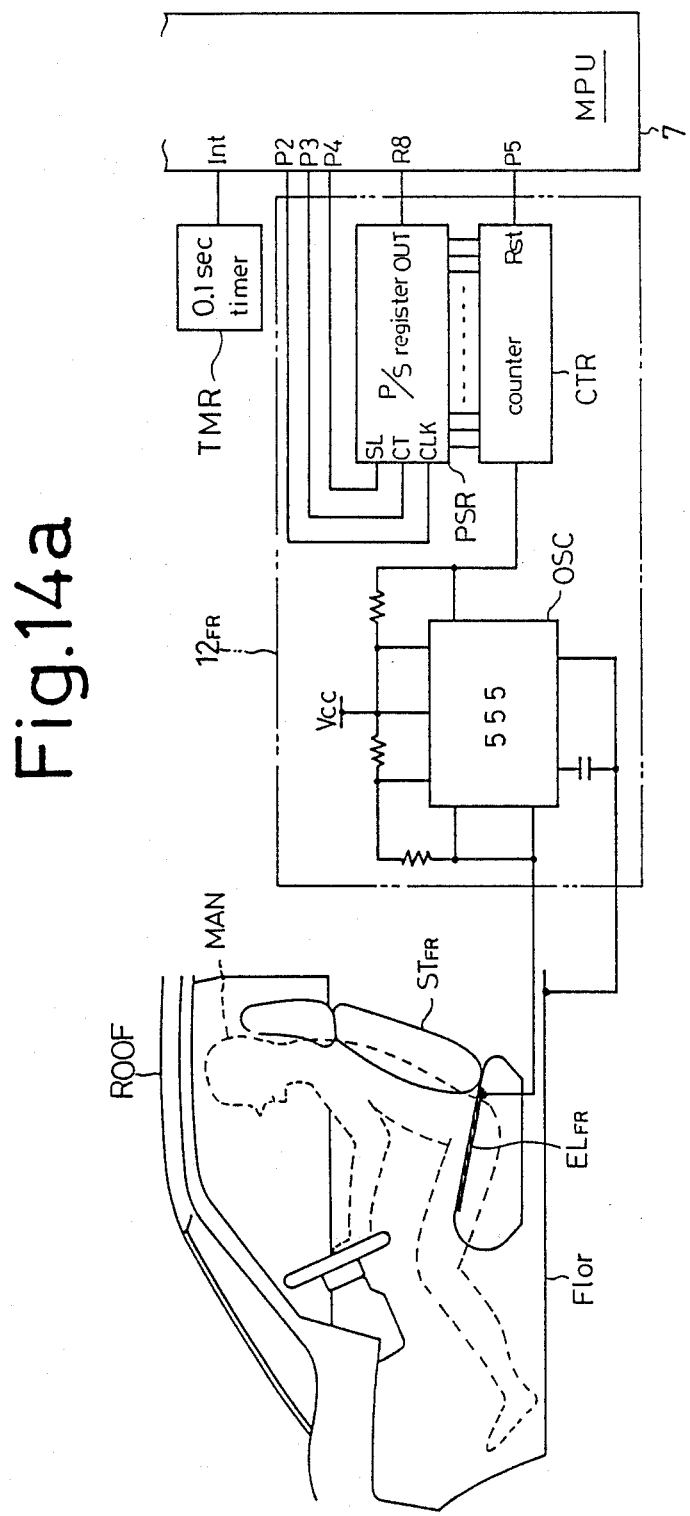
FIG. 14a is a block diagram of an arrangement according to a sixth embodiment of the invention.
Figure 14B:
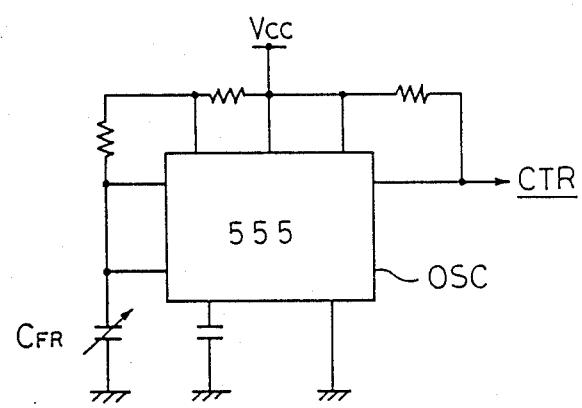
FIG. 14b is a block diagram, illustrating an equivalent circuit of a detecting electrode connected to an oscillator shown in FIG. 14a and the electric ground represented by the car body.

FIG. 14a shows an occupant detector according to a sixth embodiment of the invention which detects the presence or absence of an occupant MAN on a driver's seat $ST_{FR}$ of a vehicle. It is to be noted that similar components as appear in the first embodiment are designated by like reference characters. Referring to FIG. 14a, the detector shown comprises a microcomputer (hereafter MPU) 7, an occupant detector circuit $12_{FR}$, 0.1 second timer TMR, a detecting electrode $EL_{FR}$, the roof ROOF of a vehicle and the electrical ground represented by a car body such as a floor Flor. MPU 7 also serves as a controller for a window regulator which is not shown in FIG. 14a. The detecting electrode $EL_{FR}$ is identical to that mentioned above and illustrated in FIGS. 2a and 2b. Thus, as indicated by an equivalent shown in FIG. 14b, the combination of the detecting electrode $EL_{FR}$ and the ground defines a variable capacitance capacitor which is connected as an external element to an oscillator OSC, which then develops a signal of a frequency dependent on the capacitance of the capacitor $C_{FR}$, thus increasing the frequency as the capacitance decreases and reducing the frequency as the capacitance increases. An output from the oscillator OSC is applied to 16 bit counter CTR. The counter CTR counts the rising end of an output signal from OSC. 16 bit parallel output terminals of the counter are connected to 16 bit parallel input terminals of parallel-in and serial-out shift register (P/S register) PSR. The counter CTR has a reset input terminal which is connected to the output port P5 of MPU 7.

The P/S register PSR has a clock input terminal which is connected to the output port P2 of MPU 7, a clock inhibit input terminal CI which is connected to the output port P3 of MPU, and a shift load input terminal SL which is connected to the output port P4 of MPU. 16 bit data applied to the parallel input terminals of the P/S register PSR is preset therein in response to the rising end of a shift load pulse which is applied from MPU 7 to the shift load input terminal SL. When a clock inhibit signal which is applied from MPU 7 to the clock inhibit input terminal CI assumes its low level (L), the preset data is serially output from the output terminal OUT to serial input port R8 of MPU in synchronism with a clock pulse which is applied to the clock input terminal CLK.

0.1 second timer TMR outputs an interrupt request pulse every 0.1 second, in one example, which pulse is applied to an external interrupt request terminal Int of MPU 7.

Figure 15:
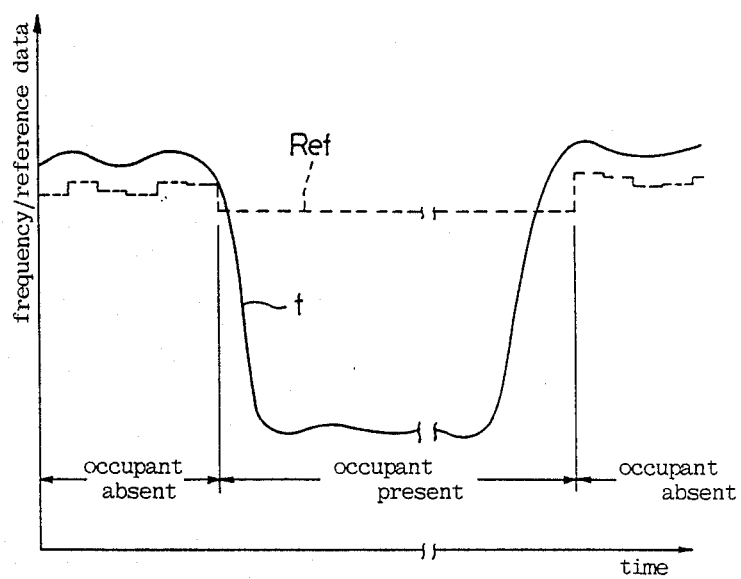
FIG. 15 graphically shows the oscillation frequency of the oscillator shown in FIG. 14a as well as reference data plotted against time.

Referring to FIG. 15, a general operation of the detetor shown in FIG. 14a will be described. In FIG. 15, a solid line curve represents the oscillation frequency f of the oscillator OSC and a broken line curve represents reference data Ref, both of which change with time, one example being shown. MPU 7 samples the number of pulses which are output from the oscillator OSC (corresponding to the oscillation frequency f of the oscillator) through the counter CTR and P/S register PSR in response to the interrupt from the 0.1 second timer TMR or at a time interval of 0.1 second, thus establishing frequency data which corresponds to the number of pulses. It also determines variation data corresponding to a change in the oscillation frequency f with time, based on the frequency data which is established anew and the old frequency data (that is, the frequency data which has been established in response to the immediately preceding timer interrupt). If variation data indicates a change in the oscillation frequency f within a given range, it determines "the absence of an occupant" and updates the reference data Ref by substituting the frequency data therefor. If variation data indicates a decrease in the oscillation frequency f which exceeds the given range mentioned above, indicating that the capacitance has increased rapidly, the microcomputer determines "the presence of an occupant", and fixes the reference data Ref. Thus, when "the presence of an occupant" is determined, the reference data Ref is not updated in response to subsequent timer interrupts, but the prevailing frequency data is compared against the fixed reference data until a value indicated by the frequency data exceeds a value indicated by the reference data Ref (a reduction in the capacitance), whereupon "the absence of an occupant" is determined.

Figure 16A:
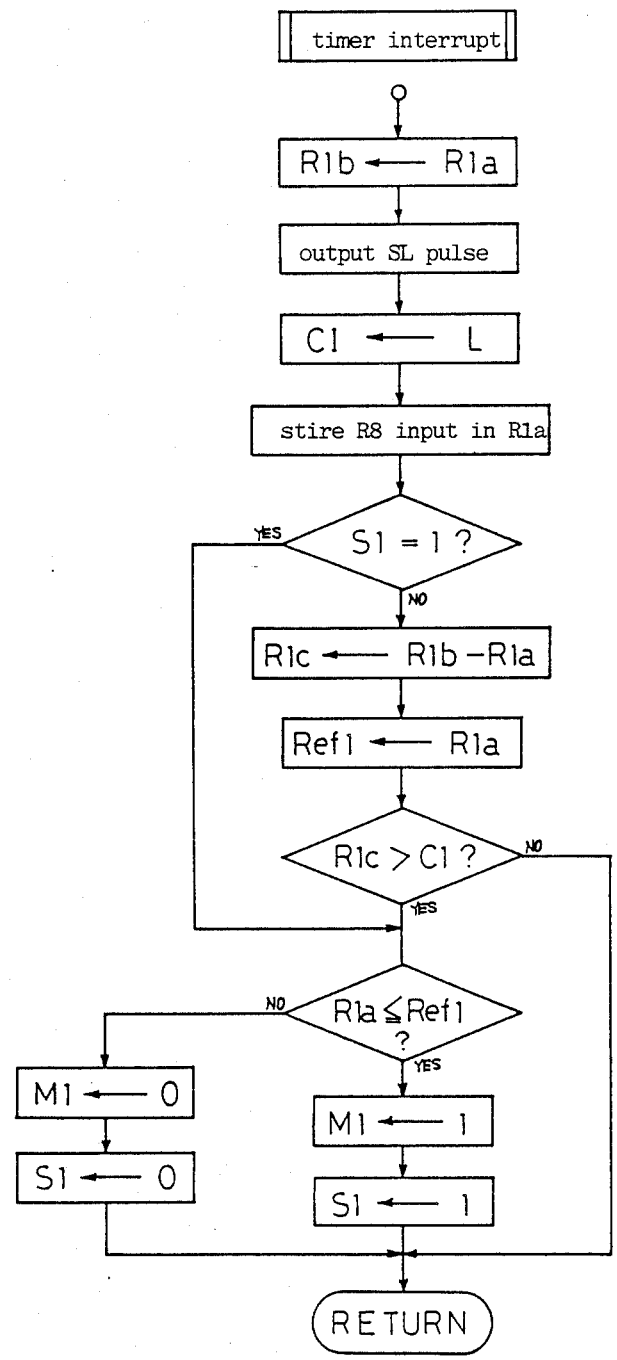
FIGS. 16a and 16b are flowcharts illustrating a timer interrupt processing operation by a microcomputer shown in FIG. 14a or FIG. 19.

FIG. 16a is a flowchart illustrating a processing operation by MPU 7 in response to a timer interrupt, which occurs generally in the same manner mentioned in the preceding paragraph. During a processing operation which takes place in response to a timer interrupt, the content of a register R1a is loaded into a register R1b. As will be apparent from the following description, the content of the register R1a represents frequency data which is obtained as a result of the processing operation which occurred in response to the previous timer interrupt, or old frequency data which prevailed 0.1 second before. Subsequently, when the shift load pulse SL is delivered to the shift load input terminal of P/S register PSR, the register PSR preset 16 bit data supplied from the counter CTR to the parallel input terminal thereof into respective bit positions. Subsequently, the reset pulse is applied to the reset input terminal Rst of the counter CTR to reset it. In this manner, the counter CTR counts a number of pulses which is developed by the oscillator OSC during the time from the occurrence of a timer interrupt to the next occurrence of another timer interrupt. In response to the application of a low level (L) to the clock inhibit input terminal CI, the P/S register PSR serially outputs data which is preset therein through the output terminal OUT in synchronism with the clock pulse, and such output is read at the serial input port R8 and is stored as frequency data in register R1a.

The detail of register S1 will be described later, but it may be assumed for the moment that S1=0. Then the content of register R1b from which the content of register R1a is subtracted, or a difference therebetween, stored in register R1c as representing variation data. After storing the content of register R1a as reference data in register Ref1, the content of register R1c (variation data) is compared against a first threshold value C1. If the content of register R1c is equal to or less than the first threshold value C1, the program then directly returns to a main routine (not shown). However, when the content of register R1c exceeds the first threshold value C1, "1" is loaded into register M1 and register S1 before the program returns to the main routine (not shown). It is to be noted that at this time the content of register Ref1 is equal to the content of register R1a. M1=1 represents "the presence of an occupant".

When "1" is loaded into register S1, the content of register Ref1 (which represents reference data) is not updated, but remains fixed during the processing operation which occurs in response to the next timer interrupt, whereby a fresh content of register R1a (frequency data) is compared against a previously loaded content of register Ref1 (reference data). If it is found by such comparison that the content of register R1a exceeds the content of register Ref1, "0" is loaded into register M1 and register S1 before the program returns to the main routine (not shown). M1=0 represents "the absence of an occupant".

In the flowchart shown in FIG. 16a, when S1=0, the content of register R1a is loaded into register Ref1 as reference data, but the content of register R1b, that is, the frequency data which was obtained one interrupt before or 0.1 second before may be loaded instead.

Figure 16B:
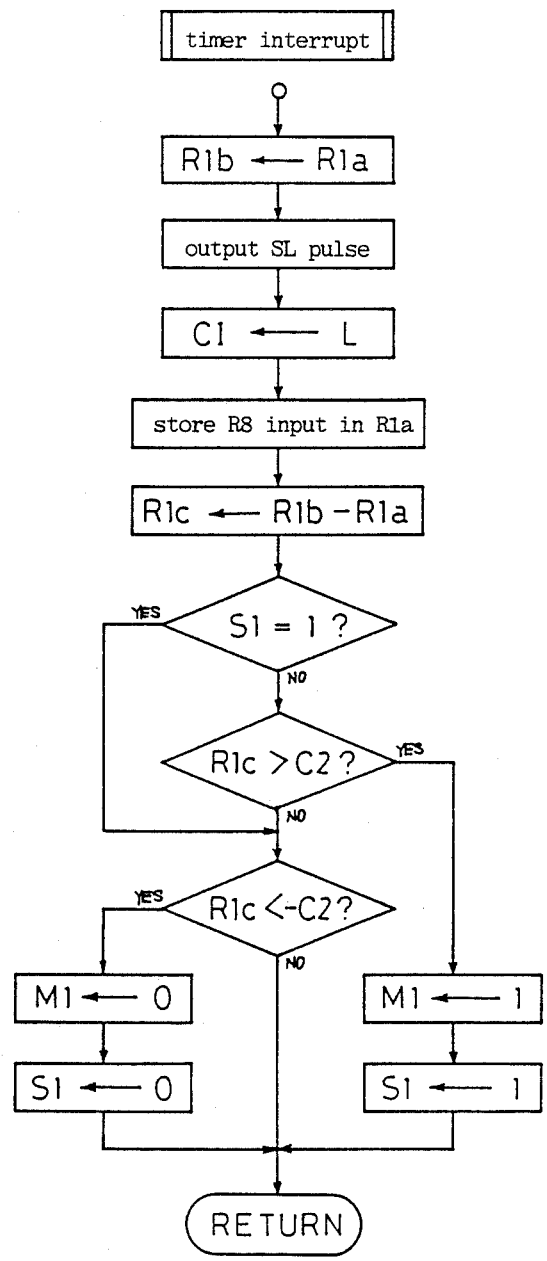

FIG. 16b is a flowchart of a modification of the processing operation by MPU 7 which occurs in response to a timer interrupt. As before, current frequency data is loaded into register R1a, previous frequency data which is obtained one interrupt before is loaded into register R1b, and a value corresponding to the content of register R1b from which the content of register R1a is subtracted is stored in register R1c as variation data. If register S1 is equal to 0, the value in register R1c is compared against a second threshold value C2. If the content of register R1c (variation data) exceeds the second threshold value C2, "1" is loaded into register M1 and register S1 before the program returns to the main routine (not shown). As before, M1=1 represents "the presence of an occupant". If the content of register R1c (variation data) is less than the negative of the second threshold value ($-C2$), "0" is loaded into register M1 and register S1 before the program returns to the main routine (not shown). M1=0 represents "the absence of an occupant" as before. Thus, in this modification, "the presence of an occupant" is declared when variation data indicates a reduction in the oscillation frequency f of the oscillator OSC (or an increase in the capacitance) and a change in absolute value indicated by the variation data exceeds a first given value (which is equal to the second threshold value C2). On the contrary, "the absence of an occupant" is declared when variation data indicates an increase in the oscillation frequency f of the oscillator (or a decrease in the capacitance) and a change in absolute value indicated by the variation data exceeds a second given value (which is equal to the second threshold value C2).

A number of modifications of the processing operation which take place in response to a timer interrupt as indicated in the flowcharts of FIGS. 16a and 16b may be employed by changing the form of comparison. In any instance, the comparison is based on the concept that "the presence or absence of a personnel" is determined in accordance with a change in the capacitance between a first and a second electrode with time, resulting in no essential difference in any instance.

Figure 17:
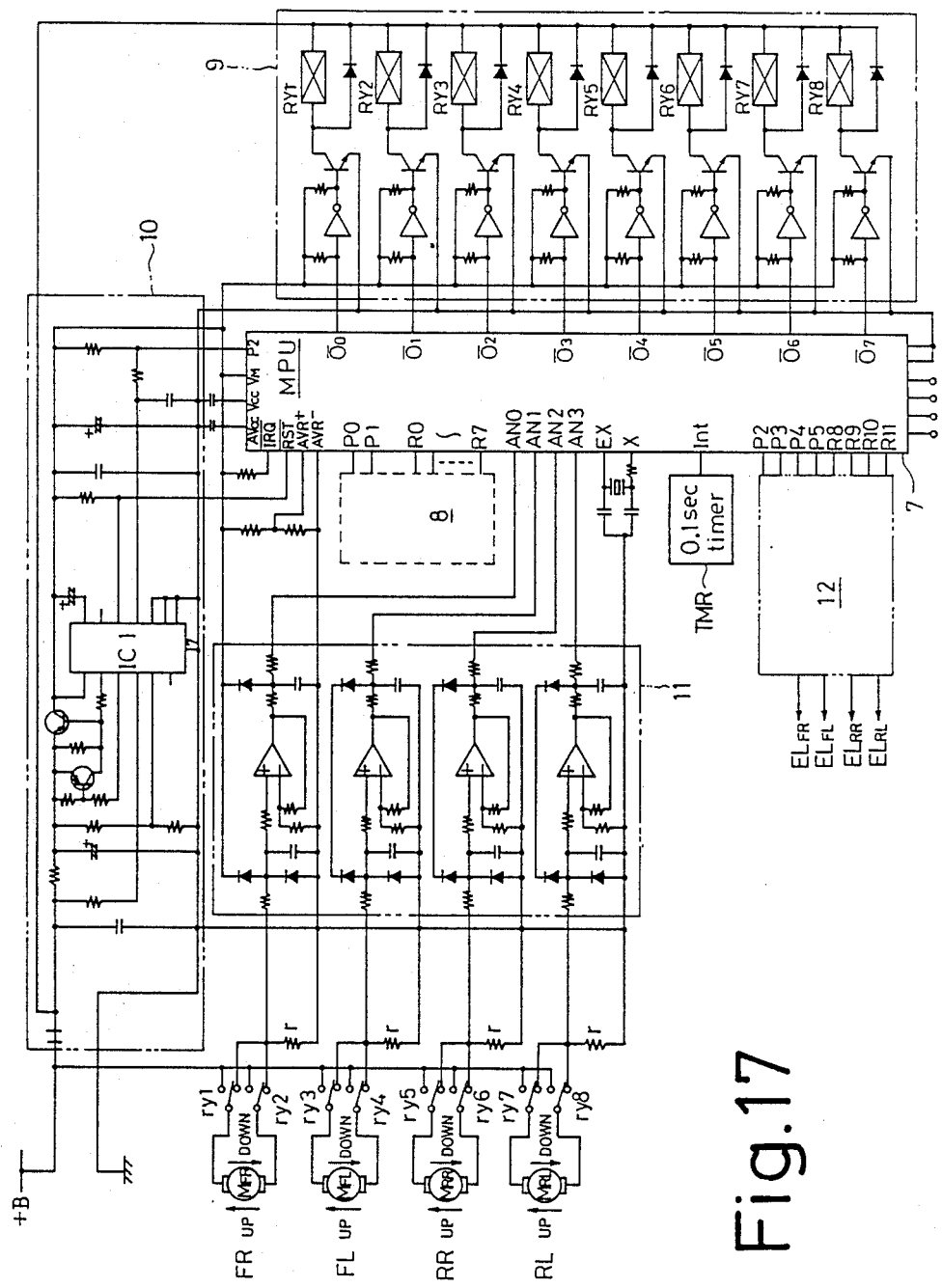

FIG. 17 shows a window regulator of a vehicle which incorporates an occupant detector shown in FIG. 14a. The arrangement is identical with that shown in FIG. 5a except for 0.1 second timer TMR and the occupant detector circuit 12. Accordingly, these similar parts will not be specifically described.

The detector circuit 2 shown in FIG. 17 comprises four detector circuits, each of which is identical with the occupant detector circuit 2 shown in FIG. 1a, thus each including an oscillator OSC, a counter CTR and a P/S register PSR. Connected to each oscillator are a detecting electrode $EL_{FR}$ which is mounted on the driver's seat $ST_{FR}$, a detecting electrode $EL_{FL}$ mounted on an assistant driver's seat, a detecting electrode $EL_{RR}$ mounted on a seat which is located directly behind the driver's seat, and a detecting electrode $EL_{RL}$ mounted on a seat which is located directly behind the assistant driver's seat. The output terminal OUT of each P/S register is connected to serial input port R8, R9, R10 or R11 of MPU 7, CLK input terminal, CI input terminal and SL input terminal of each P/S register are connected to output ports P2, P3 and P4, respectively, of MPU 7 in parallel. The reset input terminal Rst of each counter is connected to the output port P5 of MPU 7 in parallel.

Figure 18A:
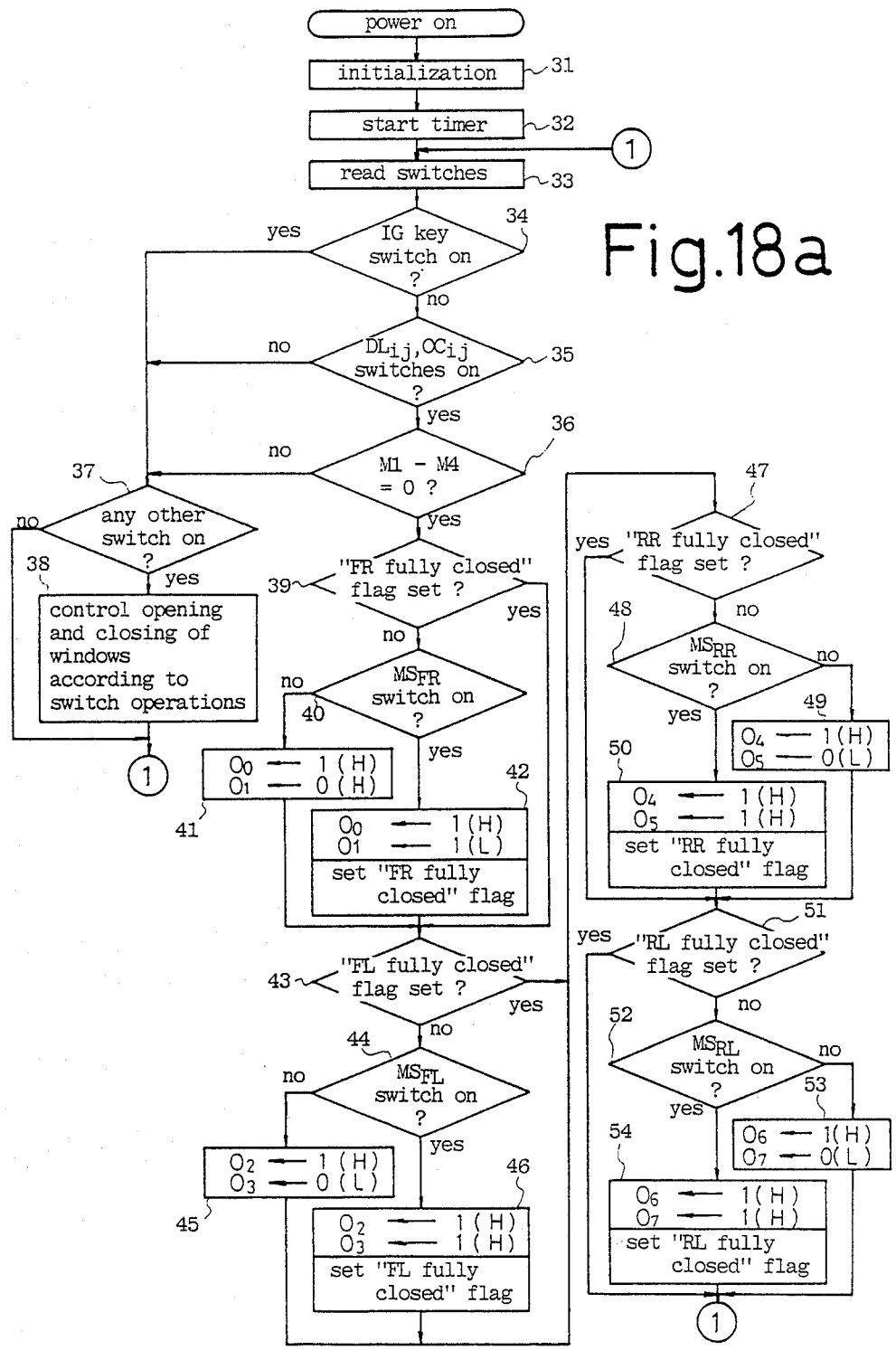
FIG. 18a is a flowchart illustrating a control operation by the microcomputer shown in FIG. 17.
Figure 18B:
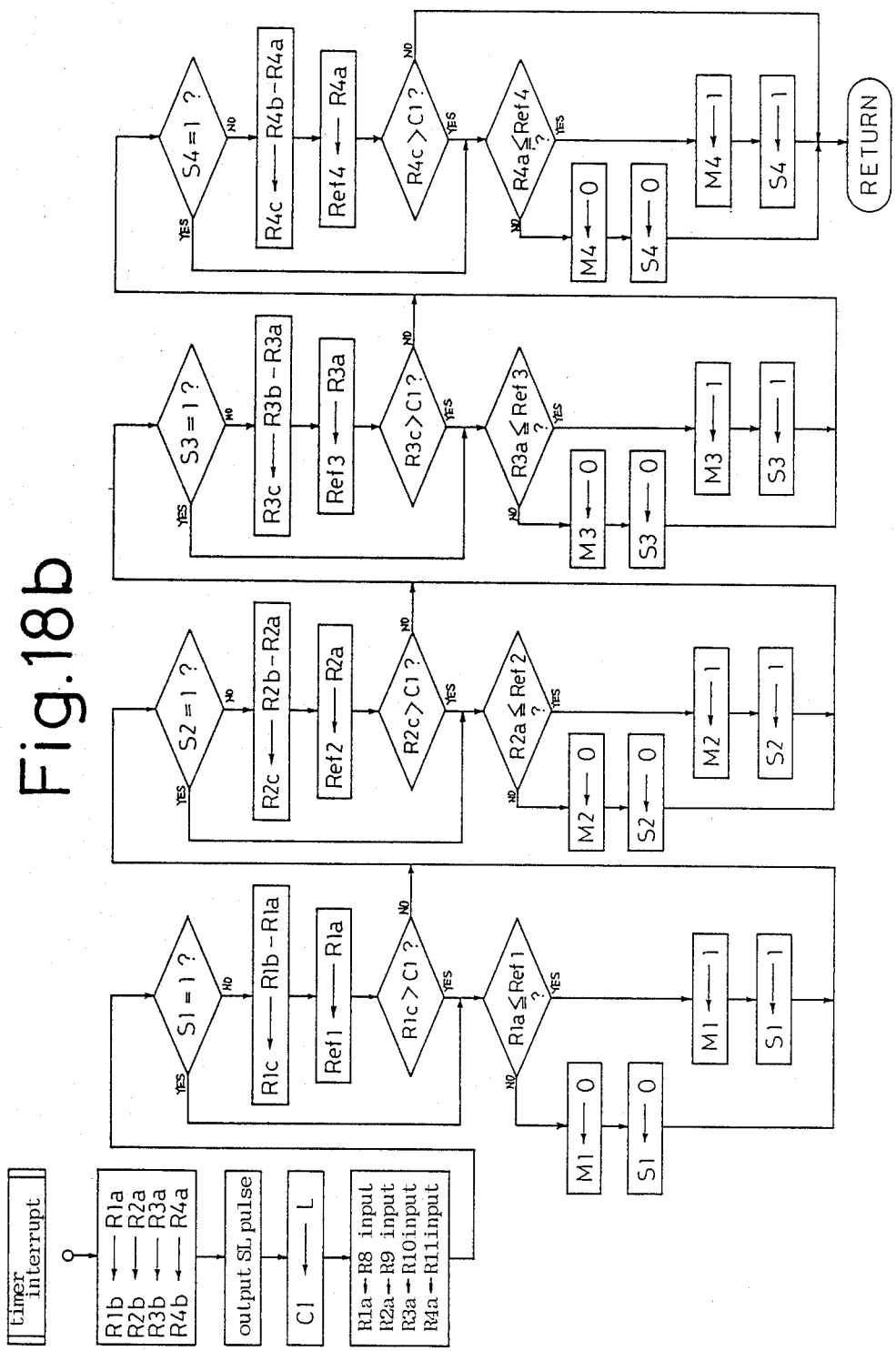
FIG. 18b is a flowchart illustrating a timer interrupt processing operation by the same microcomputer.

FIG. 18a shows a flowchart illustrating an operation of MPU 7 for controlling the elevating movement of each glass pane, and FIG. 18b shows a flowchart of a processing operation by the microcomputer which takes place in response to a timer interrupt for detecting the presence or absence of an occupant on each seat. Referring to FIG. 18a, the control of the elevating movement of each glass pane which is performed by MPU 7 remains basically the same as the control operation in the first embodiment shown in FIG. 7. However, in the present embodiment, a timer TMR start step S32 is added. In addition, while the status of input ports R8 to R11 have been monitored at S6 in the first embodiment, the content of registers M1 to M4 are monitored at S36 in the present embodiment. The remaining steps in the flowchart shown in FIG. 18a remain quite the same as described before, and therefore will not be described repeatedly.

In the present embodiment, when the timer TMR presents an interrupt request every 0.1 second, MPU 7 executes a processing operation responsive to a timer interrupt as indicated in FIG. 18b. Referring to FIG. 18b, the processing operation is an extension of the processing operation shown by the flowchart of FIG. 16a so as to detect the presence or absence of an occupant on any of driver's seat, assistant driver's seat, seats located directly behind the first mentioned seats. Initially, the content of registers R1a, R2a, R3a and R4a are written into registers R1b, R2b, R3b and R4b, respectively. The content of registers R1a, R2a, R3a and R4a represent frequency data for the four seats which are obtained in response to the immediately preceding timer interrupt operation or which prevailed 0.1 second before.

After delivering the shift load pulse SL to the shift load input of each P/S register and applying the reset pulse to the reset input terminal Rst of each counter, a low level (L) is applied to the clock inhibit input terminal CI of each P/S register in order to read inputs at respective serial input ports R8, R9, R10 and R11, the content of which is stored in registers R1a, R2a, R3a, and R4a as frequency data.

If the content of register S1 is not equal to 1, the content of register R1a is subtracted from the content of register R1b to provide variation data which is stored in register R1c. The content of register R1a is stored in register Ref1 as reference data, and the content of register R1c (variation data) is compared against a first threshold value C1. If the content of register R1c exceeds the first threshold value C1, "1" is loaded into register M1 and register S1. At this time, the content of register R1a is equal to the content of register Ref1.

When register S1 is set to "1", the content of register Ref1 (reference data) is not updated, but remains fixed during the processing operation which takes place in response to the next timer interrupt, and the content of register R1a (new frequency data) is compared against the previously loaded content of register Ref1 (reference data). If it is found by such comparison that the content of register R1a exceeds the content of register Ref1, "0" is loaded into register M1 and register S1. M1=1 represents "the presence of an occupant on the driver's seat" while M1=0 represents "the absence of an occupant on the driver's seat".

In a similar manner, registers M2, M3 and M4 are loaded. Specifically, M2=1 represents "the presence of an occupant on the assistant driver's seat" while M2=0 represents "the absence of an occupant on such seat". M3=1 represents "the presence of an occupant on a seat located directly behind the driver's seat" while M3=0 repreents "the absence of an occupant on such seat". Finally, M4=1 represents "the presence of an occupant on a seat located directly behind the assistant driver's seat" while M4=0 represents "the absence of an occupant on such seat". The content of registers M1 to M4 which are loaded in this manner is monitored at step S36 mentioned above in order to control the elevating movement of each glass pane in accordance with the presence or absence of an occupant.

It is contemplated that this sixth embodiment may be combined with one of second, third and fourth embodiments described above, thus providing various modifications. However, since this represents a repetition of what has been described, such modifications will not be specifically described.

Figure 20A:
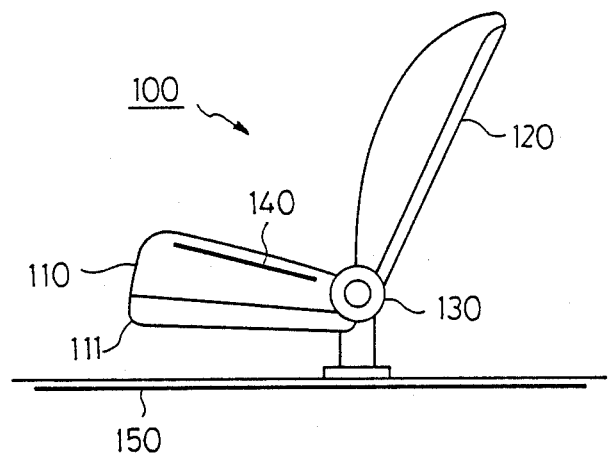
FIG. 20a is a side elevation of a theater seat.
Figure 20B:
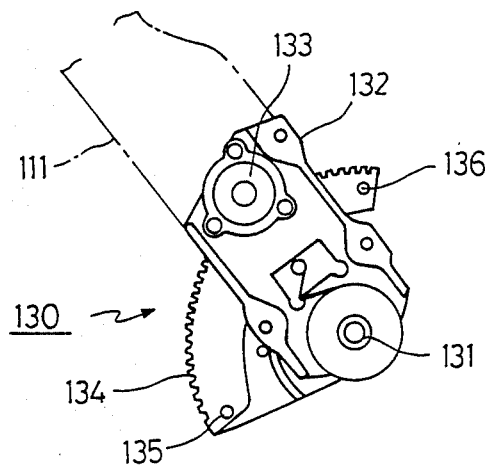

A seventh embodiment of the invention will be described. FIG. 20a is a side elevation of a seat 100 which may be installed in a theater. The seat 100 comprises a seat cushion assembly 110 and a seat back assembly 120 which are coupled together by a spring-up mechanism 130, which is illustrated in FIG. 20b. In this Figure, the spring-up mechanism 130 comprises a lift arm 132 which is fastened to a frame 111 of the seat cushion assembly 110 and a driven gear secured to the seat back assembly, both of which are pivotally connected through a hinge 131. A motor 133 is fixedly mounted on the lift arm 132 and has a rotary shaft on which a drive gear, not shown, is fixedly mounted, for meshing engagement with the driven gear 134. Thus, when the motor 133 is energized, the lift arm 132 moves clockwise, as viewed in this Figure, thus causing the seat cushion assembly 110 to spring up. The driven gear 134 is provided with a lower stop 135 and an upper stop 136, which are effective to limit the rotation of the lift arm 132. When the lift arm 132 abuts against the upper stop 136, a limit switch SWx, not shown, is turned on. A first detecting electrode 140, which may comprise a fabric of electrically conductive fibers, a metal foil or a sputtered-on conductive paint, is mounted on the skin of the seat cushion assembly 110 while a second detecting electrode 150 which may comprise a metal foil, a fabric of conductive fibers or sputtered-on conductive paint, is laid down along the floor surface.

Figure 19:
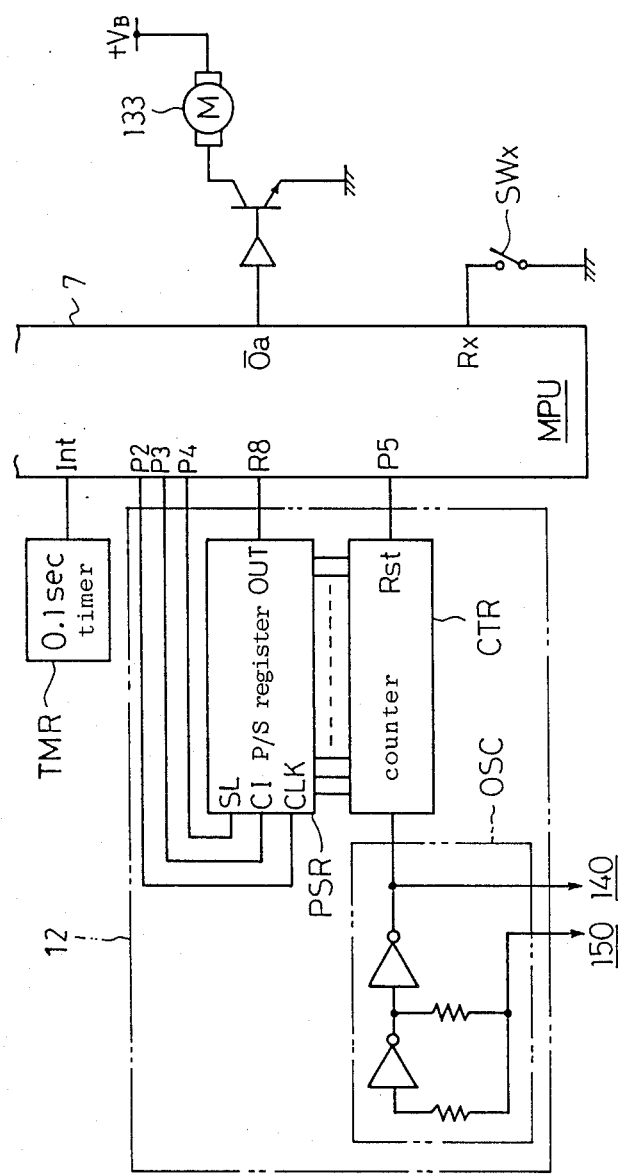
FIG. 19 is a block diagram of a personnel detector according to a seventh embodiment of the invention which may be used in association with a theater seat.
Figure 21:
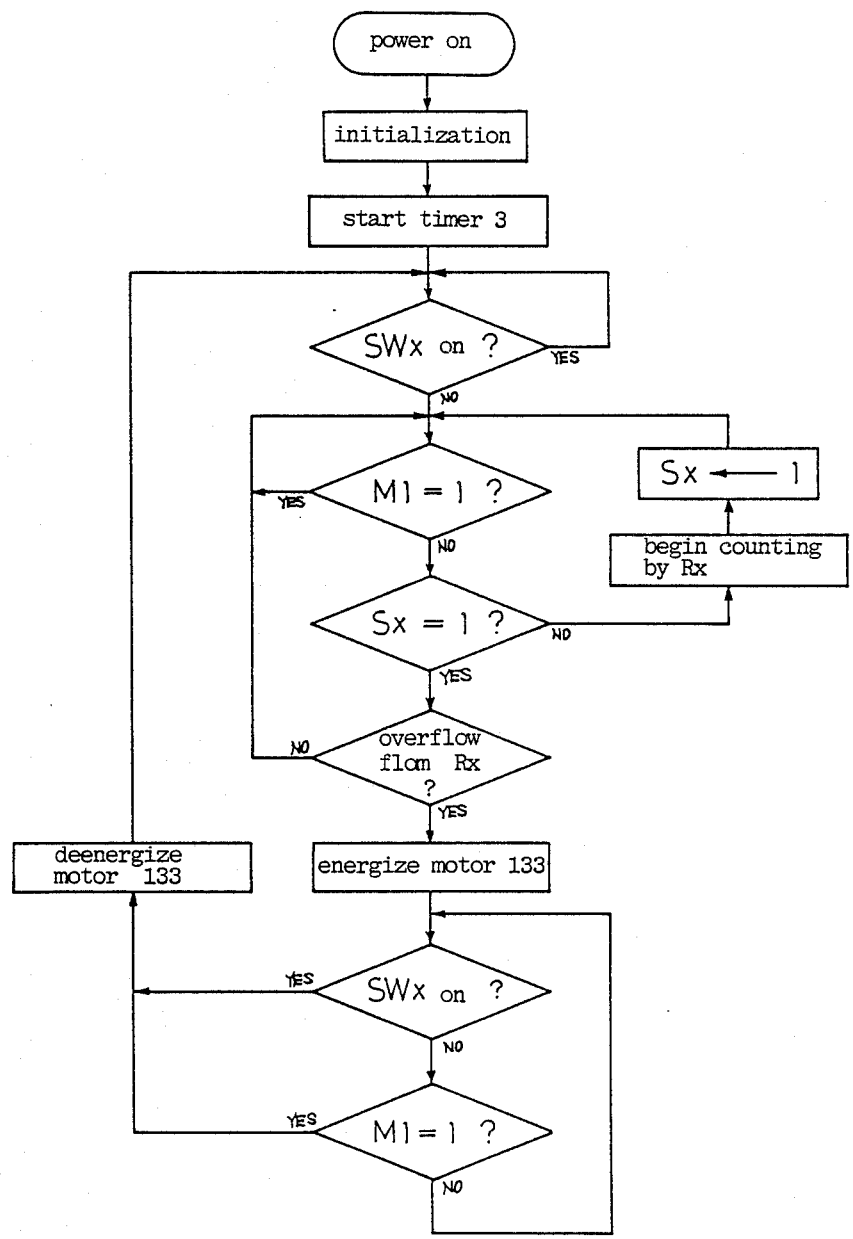
FIG. 21 is a flowchart illustrating a control operation by the microcomputer shown in FIG. 19.

FIG. 19 shows a personnel detector associated with the seat 100, and a seat controller which utilizes the detector. It is to be noted that similar parts as those shown in FIG. 14a which function in the same or equivalent manner are designated by like reference characters. The first detecting electrode 140 mounted on the seat 100 and the second detecting electrode 150 laid along the floor surface are connected to an oscillator OSC of a personnel detector circuit 2. In the example shown, the oscillator OSC comprises C-MOS IC oscillator, which functions in the same manner as the oscillator OSC shown in FIG. 14a. A counter CTR, P/S register PSR and 0.1 second timer TMR function in the same manner as before, and therefore will not be described. MPU 7 includes an input port RX which is connected to the limit switch SWx mentioned above, and also includes an output port Oa which is connected to a motor driver for the motor 133 (in the drawing, this port is indicated with an overscore to indicate that the port is L level active). Generally, MPU 7 operates to energize the motor 133 of the spring-up mechanism 130 to raise the seat cushion assembly 110 in a resilient manner, to thereby clear a passageway whenever no person is seated upon the seat 100. Such operation will be more specifically described with reference to a flowchart shown in FIG. 21 which illustrate the operation of MPU 7.

When the power is turned on, an initialization takes place and the timer TMR starts. As before, the timer TMR generates an interrupt request every 0.1 second, whereupon MPU 7 executes a processing operation in response to a timer interrupt which is indicated by a flowchart of FIG. 16a or a flowchart of FIG. 16b. The processing operation remains the same as before, and therefore will not be described. If the limit switch SWx is on, this means that the seat cushion assembly 110 has been resiliently raised already, and accordingly, the program loops around in a standby mode. If the switch is not on, the content of register M1 is examined. If a person is seated upon the seat 100, register M1 is set to "1" during the processing operation, and the program loops around, thus establishing a condition of use. Otherwise, a counting of the number of clocks by register Rx is initiated. This register Rx functions as an internal timer, extending the loop for the condition of use by a given length of time. In other words, the seat cushion assembly 110 is driven upward at a given time interval after the person has stood up from the seat 100.

When an overflow occurs from register Rx, the motor 133 is energized while clearing register Rx and flag Sx which indicates that Rx is being counted. Subsequently, the seat cushion assembly is resiliently driven upward while monitoring the status of limit switch SWx and register M1, and when the limit switch assumes on condition, indicating the completion of the spring-up operation, the motor 133 is deenergized. Alternatively, when register M1 assumes "1" before the limit switch SWx assumes its on condition, this means that the person has seated upon again, thus deenergizing the motor 133 to return to the standby loop. In the seventh embodiment described above, the detection of a personnel on a single seat of a theater has been described, but it should be self-evident that the presence or absence of personnel on a plurality of individual seats or every seat within a theater can be made by using an additional arrangement as shown in FIG. 17.

Figure 22:
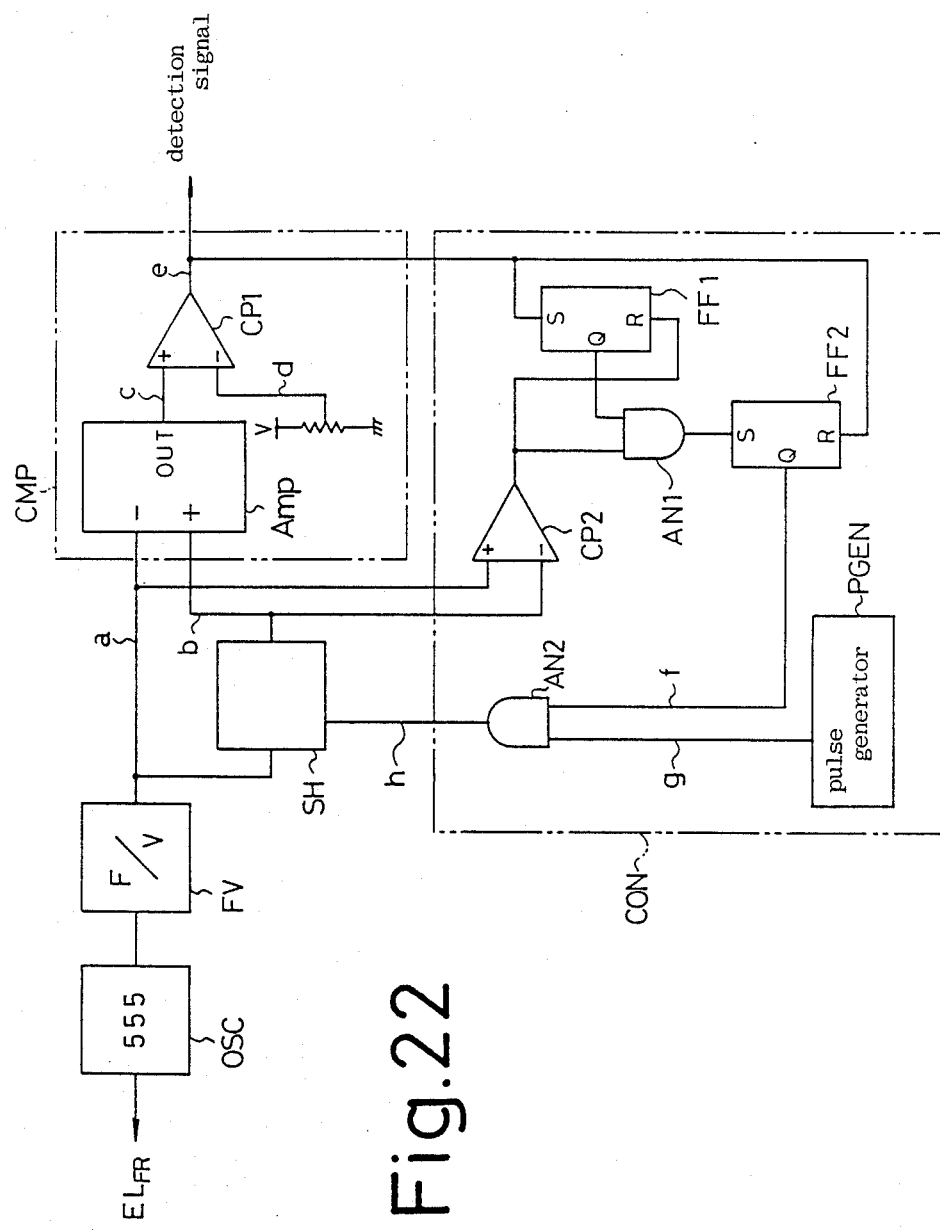
FIG. 22 is a block diagram of an eighth embodiment of the invention.
Figure 23A:
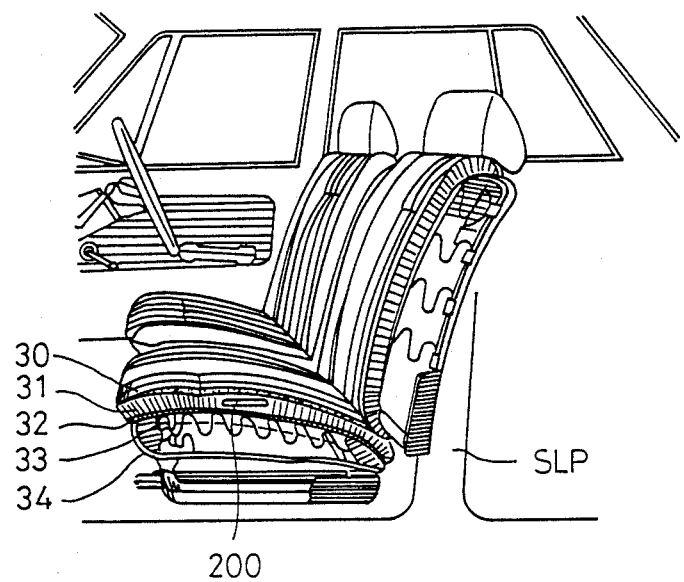
FIGS. 23a and 23b are cross sections illustrating a conventional seating switch.
Figure 23B:
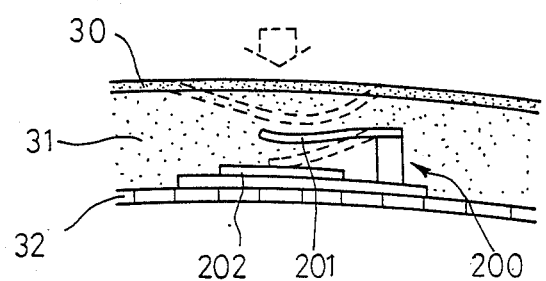

Finally, an eighth embodiment of the invention will be described with reference to FIG. 22. In this emboidment, the detetor comprises an oscillator OSC which comprises IC 555 which is the same as the oscillator OSC used in FIG. 14a, an F/V (frequency/voltage) converter FV, a sample-and-hold circuit SH, a comparison and procesing circuit CMP and a sampling control circuit CON.

The oscillator OSC is connected to the detecting electrode $EL_{FR}$ shown in FIG. 14a, and outputs an electrical signal of a frequency which depends on the capacitance between the electrode $EL_{FR}$ and the electrical ground represented by the car body. The converter FV outputs a voltage signal a which varies with the output from the oscillator OSC. An output from the converter FV is applied to the sample-and-hold circuit SH, the comparison and processing circuit CMP and the sampling control circuit CON.

The sample-and-hold circuit SH holds an oncoming input or an output from the converter FV which prevails when a sampling pulse h appears until the occurrence of next sampling pulse h, and supplies a voltage signal b to the comparison and processing circuit CMP and the sampling control circuit CON.

The comparison and processing circuit CMP comprises a differential amplifier AMP and a comparator CP1. The amplifier AMP subtracts a voltage applied to its "−" terminal from a voltage applied to its "+" terminal and outputs a voltage signal c which is equal to "b-a" through its output terminal OUT. The voltage signal c is applied to "+" terminal of the comparator CP1, "−" terminal of which receives a voltage signal d which corresponds to the first threshold value C1 (see FIG. 16b). When the voltage signal c becomes equal to or exceeds the voltage signal d, a detection signal e changes from its L level, indicating the absence of a personnel, to its H level, indicating the presence of a personnel. The detection signal e is applied to a processor of a host system, not shown, and to the sampling control circuit CON.

The sampling control circuit CON comprises a pulse generator PGEN, a pair of flipflops FF1 and FF2, a pair of AND gates AN1 and AN2, and a comparator CP2. The detection signal e is applied to the set input terminal S of the flipflop FF1 and to the reset input terminal R of the flipflop FF2. In response to a change of the detection signal e from its L to its H level, the flipflop FF1 is triggered by the rising end to set its output terminal Q to its H level while the flipflop FF2 is triggered by the same rising end to reset its output terminal Q to its L level. The Q output from the flipflop FF1 is applied to one input terminal of the gate AN2 while the Q output from the flipflop FF2 is applied to one input terminal of the gate AN2 as a pulse control signal f. The other input terminal of the gate AN2 receives an output pulse g from the pulse generator PGEN. Thus, when the comparator detects "the presence of a personnel", the gate AN2 blocks the output pulse g from the generator PGEN in response to the pulse control signal f, thus removing the sampling pulse h. Accordingly, the sample-and-hold circuit SH maintains the prevailing voltage signal b.

Subsequently, when the output voltage signal a from the converter FV exceeds the voltage signal b maintained by the sample-and-hold circuit SH, the detection signal e assumes its H level and simultaneously the comparator CP2 of the sampling control circuit CON simultaneously outputs an H level. Since the Q output from the flipflop FF1 is at its H level, this output is passed through the gate AN1 to be applied to the set input terminal S of the flipflop FF2, thus setting this flipflop. Thus, since the pulse control signal f changes to its H level, the gate AN2 again delivers the output pulse g from the generator PGEN as the sampling pulse h, which causes the sample-and-hold circuit SH to resume updating the sample voltage b. The flipflop FF1 is reset in response to the rising end of the output from the comparator CP2.

As illustrated by the eighth embodiment mentioned above, the sixth embodiment shown in FIG. 14a and the seventh embodiment shown in FIG. 19 may be constituted by an analog circuit.

What we claimed is:

1. A personnel detector comprising
personnel containment means
first and second electrodes insulated from each other and arranged such that at least part of a person present in said personnel containment means is disposed therebetween;
capacitance detecting means for detecting a capacitance between the first and the second electrodes and providing a representative electrical signal;
processing means including storage means for storing the electrical signal;
storage update means for causing the electrical signal stored in the storage means to be updated at given time intervals;
comparison means for producing an electrical signal representing the arrival of a person whenever a difference between the electrical signal developed by the capacitance detecting means and the signal stored by the storage means exceeds a first threshold value; and
means for setting a second threshold value based on the capacitance detected during the presence of a person and determining the departure of a person when the capacitance detected by the detecting means decreases below said second threshold value;
wherein said capacitance detecting means includes an oscillator means which produces a signal of a frequency which decreases with an increasing capacitance and a frequency/voltage converter.

2. A personnel detector according to claim 1 in which the electrical signal developed by the capacitance detecting means comprises a voltage signal which corresponds to the frequency developed by the oscillator means.

3. A personnel detector according to claim 2 in which the storage means comprises means for retaining a sample voltage.

4. A personnel detector according to claim 3 in which the storage update means comprises means for producing a sampling signal which is applied to the sample voltage retaining means to sample the voltage, further including blocking means for preventing a sampling signal from being produced whenever the comparison and processing means produces an electrical signal representing the presence of a person.

5. A personnel detector comprising
personnel containment means
first and second electrodes insulated from each other and arranged such that at least part of a person present in said personnel containment means is disposed therebetween;
capacitance detecting means for detecting a capacitance between the first and the second electrodes and providing a representative electrical signal;
processing means including storage means for storing the electrical signal;
storage update means for causing the electrical signal stored in the storage means to be updated at given time intervals;
comparison means for producing an electrical signal representing the arrival of a person whenever a difference between the electrical signal developed by the capacitance detecting means and the signal stored by the storage means exceeds a first threshold value; and
means for setting a second threshold value based on the capacitance detected during the presence of a person and determining the departure of a person when the capacitance detected by the detecting means decreases below said second threshold value;
wherein the first electrode comprises a conductive layer mounted on a door trim of the vehicle and the second electrode comprises the body of the vehicle.

6. A personnel detector according to claim 5 in which the conductive layer is in the form of a thin film of electrically conductive material such as a metal foil, a fabric of conductive fibers, a conductive paint applied to a film or the like.

7. A personnel detector according to claim 6 in which the conductive layer is mounted on the rear side of a skin of the door trim.

8. A personnel detector comprising
personnel containment means
first and second electrodes insulated from each other and arranged such that at least part of a person present in said personnel containment means is disposed therebetween;
capacitance detecting means for detecting a capacitance between the first and the second electrodes and providing a representative electrical signal;
processing means including storage means for storing the electrical signal;
storage update means for causing the electrical signal stored in the storage means to be updated at given time intervals;
comparison means for producing an electrical signal representing the arrival of a person whenever a difference between the electrical signal developed by the capacitance detecting means and the signal stored by the storage means exceeds a first threshold value; and means for setting a second threshold value based on the capacitance detected during the presence of a person and determining the departure of a person when the capacitance detected by the detecting means decreases below said second threshold value;

wherein the first electrode comprises a conductive layer mounted on an arm rest of the vehicle and the second electrode comprises the body of the vehicle.

9. A personnel detector according to claim 8 in which the conductive layer is in the form of a thin film of electrically conductive material such as a metal foil, a fabric of conductive fibers, a conductive paint applied to a film or the like.

10. A personnel detector according to claim 9 in which the conductive layer is mounted on the rear side of a skin of the arm rest.

11. A personnel detector comprising
personnel containment means
first and second electrodes insulated from each other and arranged such that at least part of a person present in said personnel containment means is disposed therebetween;

capacitance detecting means for detecting a capacitance between the first and the second electrodes and providing a representative electrical signal;

processing means including storage means for storing the electrical signal;

storage update means for causing the electrical signal stored in the storage means to be updated at given time intervals;

comparison means for producing an electrical signal representing the arrival of a person whenever a difference between the electrical signal developed by the capacitance detecting means and the signal stored by the storage means exceeds a first threshold value; and means for setting a second threshold value based on the capacitance detected during the presence of a person and determining the departure of a person when the capacitance detected by the detecting means decreases below said second threshold value;

wherein the first electrode comprises a conductive layer mounted on a floor mat of the vehicle and covering a major portion of the floor mat and the second electrode comprises the body of the vehicle.

12. A personnel detector according to claim 11 in which the conductive layer is in the form of a thin film of a electrically conductive material such as a metal foil, a fabric of conductive fibers, a conductive paint applied to a film or the like.

* * * * *